United States Patent [19]

Martin

[11] Patent Number: 5,608,245

[45] Date of Patent: Mar. 4, 1997

[54] ARRAY ON SUBSTRATE WITH REPAIR LINE CROSSING LINES IN THE ARRAY

[75] Inventor: Russel A. Martin, Menlo Park, Calif.

[73] Assignee: Xerox Corporation, Stamford, Conn.

[21] Appl. No.: 576,183

[22] Filed: Dec. 21, 1995

[51] Int. Cl.$^6$ ........................ H01L 31/062; H01L 31/113
[52] U.S. Cl. .................. 257/291; 257/208; 257/443; 257/758; 250/320.08; 345/93; 359/59; 364/491
[58] Field of Search .................. 257/291, 208, 257/758, 443; 345/93; 359/59; 250/370.08; 364/491

[56] References Cited

U.S. PATENT DOCUMENTS

| | | | |
|---|---|---|---|
| 5,298,891 | 3/1994 | Plus et al. | 345/93 |
| 5,303,074 | 4/1994 | Salisbury | 359/59 |
| 5,381,014 | 1/1995 | Jeromin et al. | 250/370 |
| 5,473,452 | 12/1995 | Shin | 359/59 |
| 5,475,246 | 12/1995 | Wei et al. | 257/291 |
| 5,480,812 | 1/1996 | Salisbury | 437/3 |
| 5,486,939 | 1/1996 | Fulks | 359/74 |
| 5,491,347 | 2/1996 | Allen et al. | 257/59 |
| 5,504,348 | 4/1996 | Yoshida et al. | 257/59 |
| 5,552,607 | 9/1996 | Salisbury et al. | 250/370.09 |
| 5,557,534 | 9/1996 | Wu | 364/491 |

FOREIGN PATENT DOCUMENTS

546780A1  6/1993  European Pat. Off. ......... G09G 3/36

OTHER PUBLICATIONS

Sheng, K. C., Qiu, H., Sondeno, J. R., Lam, J. K., and Addiego, G., "Laser repair processes for mass production of LCD panels," *Solid State Technology*, Jun. 1993, pp. 91,92, 94 and 95.

Martin, R., Chuang, T., Steemers, H., Allen, R., Fulks, R., Stuber, S., Lee, D., Young, M., Ho, Jr., Nguyen, M., Meuli, W., Fiske, T., Bruce, R., Thompson, M., Tilton, M., and Silverstein, L. D., "P-70: A 6.3-Mpixel AMLCD," *SID 93 Digest*, 1993, pp. 704–707.

Owen, A. E., Le Comber, P. G., Spear, W. E., and Hajto, J., "Memory Switching in Amorphous Silicon Devices," *Journal of Non-Crystalline Solids*, vol. 59 & 60, 1983, pp. 1273–1280.

Bond, J., and Levenson, M. D., "The US gears up to challenge Japan in flat panel displays," *Solid State Technology*, Dec., 1993, pp. 37, 38, and 40–43.

Photon Dynamics, Inc., *LCD Flat Panel Repair System User's Manual 3.0*, Part No. 005509, Aug. 1992, pp. 99–134.

Matsueda, Y., Ashizawa, M., Aruga, S., Ohshima, H., and Morozumi, S., "Defect–Free Active–Matrix LCD with Redundant Poly–Si TFT Circuit," *SID 89 Digest*, 1989, pp. 238–241.

(List continued on next page.)

*Primary Examiner*—Mahshid D. Saadat
*Assistant Examiner*—T. M. Arroyo

[57] ABSTRACT

A repair structure for an array with first and second sets of lines that cross includes a repair line extending within the array, approximately parallel to at least one line in the first set and crossing a subset of the lines in the second set. The repair line is separated from the lines it crosses by an insulating layer but a repair operation can form an electrical connection between the repair line and an open line it crosses by operating on the region where they cross. For example, the insulating layer can be melted so that molten metal from the lines mixes to form an electrical connection. The repair structure also includes a connecting lead outside the array through which the repair line can be electrically connected to the signal circuitry for the open line, so that the open line receives signals from or provides signals to its signal circuitry as though it were continuous. The connecting lead can be connected to the signal circuitry through a highly conductive line on a printed circuit board or through a highly conductive line on the substrate but peripheral to the array. The repair line can cross all the lines in the second set. Or the repair structure can also include a second repair line collinear with the first. A split array with scan lines and data lines can therefore include two repair structures with a total of four repair lines, allowing four repairs to be made.

27 Claims, 16 Drawing Sheets

OTHER PUBLICATIONS

Kaneko, E., *Liquid Crystal TV Displays: Principles and Applications of Liquid Crystal Displays,* KTK Scientific Publishers, Tokyo, 1987, pp. 212–277.

Morozumi, S., Oguchi, K., Misawa, T., Araki, R., and Ohshima, H., "4.25–in. and 1.51–in. B/W and Full–Color LC Video Displays Addressed by Poly–Si TFTs," *SID 84 Digest,* 1984, pp. 316–319.

Lewis, A. G. and Turner, W., "Driver Circuits for AML-CDs," *Conference Record of the 1994 International Display Research Conference and International Workshops on Active–Matrix LCDs & Display Materials,* Oct. 10–13, 1994, pp. 56–64.

U.S. Patent Application No. 08/135,944 entitled "AM TFT LCD Universal Controller", filed on Oct. 13, 1993.

U.S. Patent Application No. 08/235,015 entitled "Universal Display That Presents All Image Types With High Image Fidelity", filed on Apr. 28, 1994.

U.S. Patent Application No. 08/235,017 entitled "Presenting An Image On A Display As It Would Be Presented By Another Image Output Device Or On Printing Circuitry", filed on Apr. 28, 1994.

U.S. Patent Application No. 08/458,539 entitled "Display With Array And Multiplexer On Substrate And With Attached Digital–to–Analog Converter Integrated Circuit Having Many Outputs", filed on Jun. 2, 1995.

U.S. Patent Application No. 08/579,048 entitled "Array With Light Active Units Sized To Eliminate Artifact From Size Difference", filed on Dec. 21, 1995.

1

ARRAY ON SUBSTRATE WITH REPAIR LINE CROSSING LINES IN THE ARRAY

BACKGROUND

The present invention relates to arrays of circuitry fabricated on substrates.

Sheng, K. C., Qiu, H., Sondeno, J. R., Lam, J. K., and Addiego, G., "Laser repair processes for mass production of LCD panels," *Solid State Technology*, June 1993, pp. 91, 92, 94, and 95, describe repair techniques for liquid crystal display (LCD) panels. As shown and described in relation to FIG. 4, open lines can be repaired using spare address lines and laser welds. A spare address line can be laser welded to an open line and thereafter addressed by the driver. FIG. 5 shows how laser welding can be performed with sufficient energy that two layers of metal connect across an insulator layer so that an open defect is bypassed by a new conductive path.

Lee et al., EP-A 546 780, describe a controller integrated circuit (IC) for active matrix liquid crystal displays with serial to parallel conversion of refresh data stream to support vertically split panels as well as multiple scan drives. Beginning at page 2 line 56, Lee et al. describe a common technique of splitting a high-resolution passive supertwisted nematic (STN) liquid crystal display (LCD) panel into top and bottom halves. Data lines are separated in the mid-panel and driven from both sides with different column drivers, effectively doubling the input bandwidth without requiring high speed driver ICs, but at the cost of preparing a dual-scan data stream.

Lee et al. indicate, however, that the technique has a serious drawback as panel resolution increases—splitting the data (column) line in the middle of the panel makes data lines accessible from only one side. This leads to reduced ability to test and repair the panel, especially for defects caused by breaks in split lines. If both ends of a line are accessible, the same defect may be tolerated by shorting the broken line outside the panel or providing drivers on both ends. To meet the input sampling requirements and to be more defect-tolerant, it would be more appropriate to split the panel vertically into left and right halves, rather than splitting it into top and bottom halves. Lee et al. describe techniques for splitting the panel vertically in relation to FIG. 7.

SUMMARY OF THE INVENTION

The invention addresses a problem that arises in arrays of circuitry fabricated on substrates. A two-dimensional (2D) array, for example, may have scan lines extending in one direction and data lines in the other. Signals are provided by driving circuitry connected to one or both ends of each scan line. In a display or light valve array, signals are provided by driving circuitry connected to one or both ends of each data line, while in a sensor array, signals are typically received by sensing circuitry connected to one end of each data line.

An open may occur randomly in one of the lines during fabrication, but the array can continue to function if circuitry for driving or sensing is connected to each end of each line. Similarly, if circuitry for driving or sensing is connected to each end of each line, a short between a scan line and a data line may be repaired by cutting one of the lines at each side of the short, creating an open. In addition to the significant costs in system complexity, materials, labor and parts of additional drive or sensing circuitry, it is inconvenient or impossible in many cases to have circuitry for driving or sensing connected to each end of each line. More generally, it would be advantageous to have a wider repertoire of solutions to the problem of open lines.

A first aspect of the invention is based on the discovery of a new technique for solving the problem of open lines. The new technique provides an additional structure, referred to herein as a "repair structure," that allows repair of an open line. The repair structure includes a repair line that crosses some of the lines of the array in the region in which the lines of the array cross. The repair line is electrically connected to a connecting lead outside the array region.

In the event of an open in one of the lines that cross the repair line, an operation can be performed so that the repair line and the open line are electrically connected where they cross. As a result, both parts of the open line can be connected to the same signal circuitry, so that the open line can receive and provide signals as though it were continuous.

The new technique can be implemented in an article of manufacture that includes a substrate and array circuitry formed on a surface of the substrate. The array circuitry includes a first set of lines and a second set of lines. Each line in the first set and each line in the second set cross in a crossing region within which the lines are insulated from each other. All of the crossing regions are in an array region. Each of the lines is electrically connected to a signal lead for electrically connecting the line to its signal circuitry.

The array circuitry also includes a repair structure. The repair structure includes a repair line that is approximately parallel to at least one of the lines in the first set within the array region. The repair line crosses a subset of the lines in the second set within the array region. Each line in the subset crosses the repair line in a repair crossing region. In the repair crossing region, the repair line and the line it crosses are separated by an insulating layer in such a way that an electrical connection can be formed between the lines by operating on their repair crossing region.

The repair structure includes a connecting lead for the repair line. The connecting lead is outside the array region but electrically connected to the repair line. As a result, the repair line can be electrically connected through the connecting lead to the signal circuitry for a line in the repair line's crossing subset.

The repair line can cross all the lines in the second set. In an alternative implementation, the repair structure can include a second repair line collinear with the first but crossing a subset of the second set of lines that is mutually exclusive with the first repair line's crossing subset; in this implementation, the two repair lines can, together, cross all of the second set of lines, ensuring that each line in the second set can be repaired and allowing two repairs, one with each repair line.

Electrical connection in a repair crossing region can be made in any of a number of ways. The insulating layer can be meltable, so that electrical connection can be made by applying sufficient energy to the repair crossing region to melt the insulating layer; a laser beam or other intense electromagnetic beam could be shone on the region or an electrical or chemical heat source could be applied to the region. The insulating layer could have a structure that permits electrical connection by contact between metal surfaces through a fracture or gap in the insulating layer. The insulating layer could have a composition such that it can be made conductive, such as through electrochemical modification. Or the repair structure could include, for each repair crossing region, a switchable element that can be switched to a conductive state by electrical signals, such as by application of a high voltage.

Electrical connection to a line's signal circuitry can also be made in any of a number of ways. A wire can connect the connecting lead to a conductive line on a printed circuit board, and the conductive line can be electrically connected to the signal circuitry; the connection to the signal circuitry can be direct or through further wires and conductive lines, with the ultimate connection being made through a peripheral line on the substrate that crosses the line being repaired outside the array region. In an alternative implementation, the connecting lead can be electrically connected to a peripheral line on the substrate that extends around the array region to cross the line being repaired outside the array region. In either case, a second electrical connection to the line being repaired can also be made by operating on the region where it crosses the peripheral line.

The lines in the first set and the repair line can be formed in a first metal layer, and the lines in the second set can be formed in a second metal layer. The first and second metal layers can, for example, include aluminum, and the insulating layer separating them can be a layer of silicon nitride. The lines in the first set can be scan lines and the lines in the second set can be data lines.

The repair line can be along a side of the array region opposite the side at which the lines in the second set have signal leads, allowing repair of an open anywhere in the array, or the repair line can be at another convenient position. In either case, the repair line can be parallel to and alongside one of the lines in the first set. In an alternative embodiment, the array circuitry can include two or more repair structures with repair lines at different positions in the array region, thus allowing additional repairs.

A second aspect of the invention is based on the recognition of additional problems that arise in high resolution display arrays, such as reflective or transmissive light valve arrays used in active matrix liquid crystal displays (AMLCDs).

Each cell of an AMLCD, for example, includes a switching element such as a TFT. The switching element electrically connects the cell's light control unit to one of the data lines under control of a scan line. The time available for providing signals to or receiving signals from each cell depends on the rate at which the array is updated.

As the number of cells on each data line increases, the available voltage difference between ON and OFF voltages decreases. For effective video operation of an AMLCD, however, two time constraints must also be satisfied: The time for updating the entire array must be short enough for constancy, which can be obtained for most viewers with normal vision at frequencies of 60 flames per second and above; and the time for switching each cell between its ON and OFF voltage must be long enough that the cell can store an appropriate level of charge. These constraints interact— as the number of cells in the array increases, for example, the time for updating the entire array must become longer or the length of time to switch each cell must become shorter.

Lee et al., cited above, describe a technique that can be used to increase the number of cells in an array without increasing the number of cells on each line, the time for updating the entire array, or the time for switching each cell. The technique splits a passive LCD panel into top and bottom halves, driving data lines from both sides with different column drivers. As suggested by Lee et al., however, this technique may not be feasible without a way to repair opens in the data lines.

The second aspect of the invention is based on the recognition that repair structures as described above provide a way to repair data line opens in a split array. The second aspect of the invention therefore provides a technique in which a split array includes repair structures.

The second aspect can be implemented with a split array that has first and second repair structures as described above. The array can include scan lines extending in a first direction and data lines extending in a second direction approximately perpendicular to the first direction. The array can be split between first and second adjacent scan lines into a first part and a second part. For example, data lines in the first and second parts can be collinear, but with an open in each data line between the first and second scan lines. The repair lines can be parallel to the scan lines and positioned on either side of the split.

The second aspect thus makes it possible to repair a first open data line in the first part using the first repair line, and also to repair a second open data line in the second part using the second repair line. If the repair lines are next to each other along the split between the first and second parts, an open data line at any position in either part can be repaired. In addition, the two parts of the array could be fabricated on separate substrates that are then butted together.

The techniques described above are advantageous because they make it feasible to provide a split AMLCD with collinear data lines that are driven from opposite ends. As a result, array size can be doubled without violating time constraints or otherwise sacrificing image quality. For example, with technology in which a solid array with 2000 scan lines could be implemented, a split array with 4000 scan lines can be implemented.

More generally, the techniques described above are advantageous for arrays in which an inoperable portion of a line at any location can be significant. In addition to displays, such arrays include light valve arrays and sensor arrays. The techniques described above allow repair of cells that would otherwise be lost due to open lines; the techniques described above may therefore save an entire array that would otherwise be unacceptable due to a small number of open lines. The techniques are especially advantage for large, high resolution arrays in which the probability of at least one error in an array is relatively high but the probability of a large number of errors in an array is relatively low.

The following description, the drawings, and the claims further set forth these and other aspects, objects, features, and advantages of the invention.

DETAILED DESCRIPTION

A. Conceptual Framework

Figure 1:
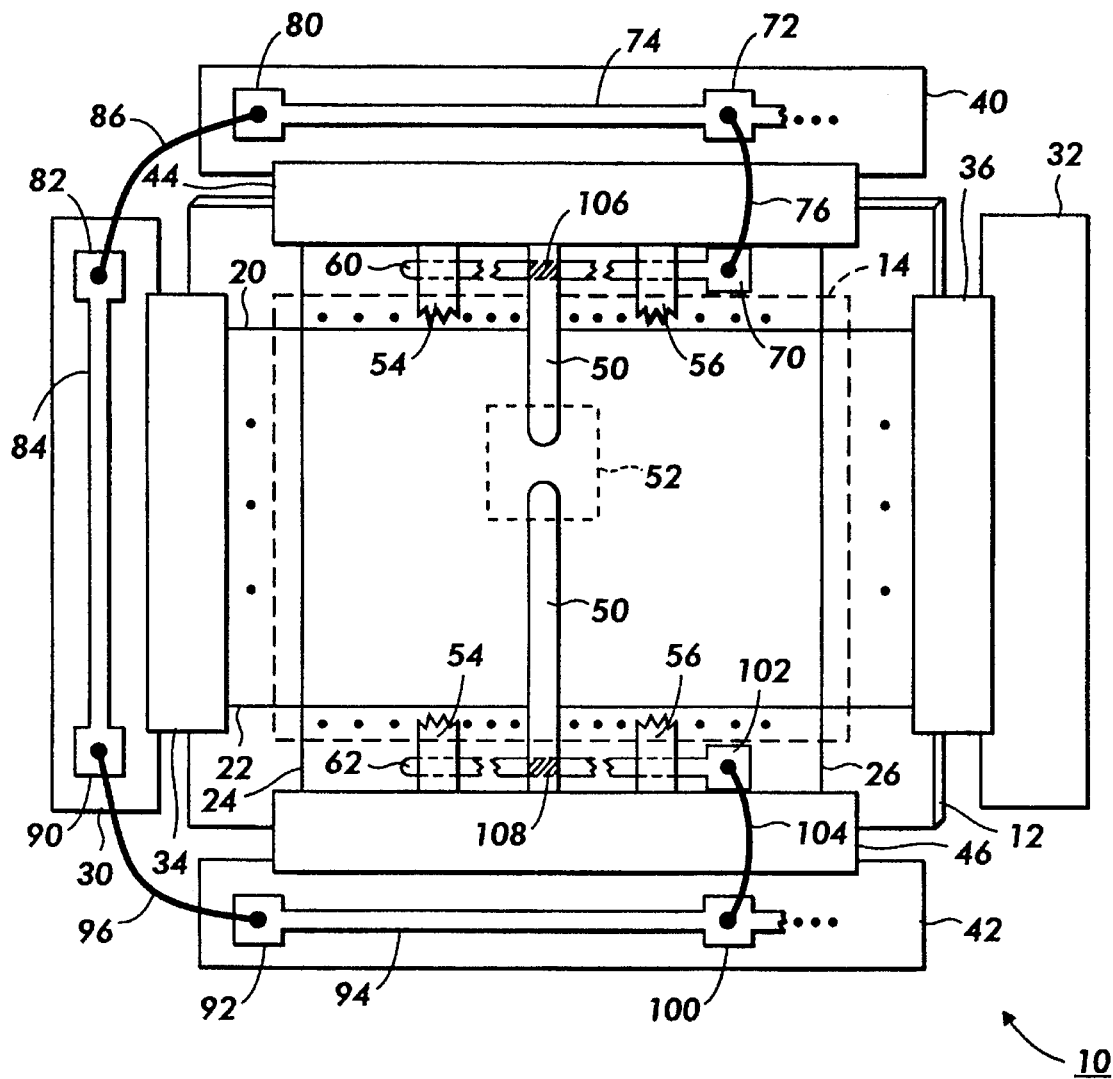
FIG. 1 is a schematic diagram showing a prior art AMLCD with an open line repaired using peripheral lines.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the timing or content of the second signal includes information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not in physical contact, such as through a combination of conductive components that are electrically connected between them.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow.

A "thin-film structure" is an electric structure that is formed at a surface of an insulating substrate. A thin-film structure could be formed, for example, by deposition and patterned etching of films on the insulating substrate's surface.

An "integrated circuit" is a circuit formed at a substrate's surface by batch processes such as deposition, lithography, etching, oxidation, diffusion, implantation, annealing, and so forth.

A "layer" is a thickness of material formed over a surface and extending generally parallel to the surface, with one side toward the surface and another side away from the surface.

An "insulating layer" is a layer formed of a non-conductive material.

A "patterned layer" is a layer in which a pattern has been formed, such as by performing lithography to produce a pattern of mask material and by then etching away either the part of the layer that is not covered by the pattern or the part that is covered.

A "lead" is a part of a component at which the component is electrically connected to other components. A "line" is a simple component that extends between and electrically connects two or more leads. A line is "connected between" the components or leads it electrically connects. A "conductive line" is a line that is conductive between the leads it connects. A lead of a component is "connected" to a lead of another component when the two leads are electrically connected by a combination of leads and lines. In an integrated circuit, leads of two components may also be "connected" by being formed as a single lead that is part of both components.

Two lines are "approximately parallel" if they do not cross and if the shortest distance between them at any point is approximately equal to the shortest distance between them at any other point.

A line in an electric structure is "parallel to and alongside" another line in the structure if the lines are parallel and closer to each other than to other lines and there are no other significant parts of the structure between them. Two such lines may, however, be separated by a small number of insulating layers.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

"Signal circuitry" for a line in an array is circuitry for providing signals to or receiving signals from the line.

An "error" or "defect" in an electric structure is a part of the structure that does not function properly due to random or uncontrolled events that occur during production of the structure. Examples of errors and defects include open lines and shorts between lines. An act "repairs" an error or defect in a structure by modifying the structure so that circuitry in the structure functions properly.

A "split array" is an array that is divided into two separate arrays. A "split data line" is the combination of two collinear data lines in a split array that is divided between two scan lines; a split data line has an open between the two scan lines along the split, but the open is not an error—it divides the split data line into the two collinear data lines.

An operation "identifies" a line as open if the operation determines that the line is a defective open line.

An open line in an electric structure can receive signals from or provide signals to other circuitry "as though the open line were continuous" if the structure has been repaired and if, as a result of the repair, all parts of the open line receive signals from or provide signals to the other circuitry in such a way that the other circuitry can function in the way it would function if the open line were continuous.

A "repair structure" is a part of an electric structure that can be used in repairing the electric structure.

A "repair line" is a line in an electric structure that can be used in repairing the electric structure. A repair structure may include one or more repair lines.

A "crossing region" is a region in which two lines cross, such as a scan line and a data line.

A "repair crossing region" is a region in which a repair line crosses another line that the repair line could be used to repair.

Lines that cross are "insulated from each other" within their crossing region if they are separated throughout the crossing region by insulating material and therefore are not electrically connected in the crossing region.

An operation "forms" an electrical connection by producing an electrical structure through which current can flow between components.

A repair line and a line it crosses in a repair crossing region are separated in their repair crossing region by an insulating layer in such a way that "an electrical connection can be formed between the repair line and the crossing line by operating on their repair crossing region" if the lines are insulated from each other in the repair crossing region by the insulating layer and if the structure of the repair crossing region allows an electrical connection to be formed between the lines by operating on the repair crossing region. For example, it may be possible to form an electrical connection by melting the insulating layer using a laser or other energy source so that material from the two lines mixes. Or it may be possible to mechanically deform the insulating layer to produce an opening through which metal-to-metal contact between the two lines forms an electrical connection. Or a part of the insulating layer might be made conductive to form an electrical connection. Or the repair crossing region may include a switchable element that is switched to form an electrical connection in response to electric signals on one or both of the lines.

In an array that includes two sets of lines that cross, such as scan lines and data lines, an "array region" is a bounded region that includes the crossing regions in which lines in the two sets cross. A "peripheral region" is a region outside the array region's boundary.

B. Prior Art Repair Technique

FIG. 1 shows display 10 that has been repaired using peripheral lines, each of which crosses a number of data lines. A display that includes the features of display 10 shown in FIG. 1 was publicly demonstrated in May 1993 at SID, and the demonstrated display is described in Martin, R., Chuang, T., Steemers, H., Allen, R., Fulks, R., Stuber, S., Lee, D., Young, M., Ho, J., Nguyen, M., Meuli, W., Fiske, T., Bruce, R., Thompson, M., Tilton, M., and Silverstein, L. D., "P-70: A 6.3-Mpixel AMLCD," *SID 93 Digest,* 1993, pp. 704–707.

Display 10 includes substrate 12 with a surface that includes array region 14. Each of scan lines 20 through 22 crosses each of data lines 24 through 26 in a crossing region within array region 14. Each of scan lines 20 through 22 is connected to signal circuitry on one or both of printed circuit boards (PCBs) 30 and 32 through tape automated bonding (TAB) structures 34 and 36, respectively. Similarly, each of data lines 24 through 26 is connected to signal circuitry on one or both of PCBs 40 and 42 through TAB structures 44 and 46, respectively; in the display demonstrated to SID, for example, alternating data lines were driven from opposite ends.

Data line 50, shown in greater detail, has an open in region 52, and is one of a subset of data lines 24 through 26 that includes data lines 54 through 56. Peripheral line 60 crosses each of data lines 54 through 56 outside array region 14 near TAB structure 44, and peripheral line 62 crosses each of data lines 54 through 56 outside array region 14 near TAB structure 46. Any of data lines 54 through 56 could instead be repaired as shown for data line 50, but only one of data lines 54 through 56 could be repaired using peripheral lines 60 and 62.

FIG. 1 shows that lead 70 of peripheral line 60 can be connected to lead 72 of conductive line 74 on PCB 40 by wire 76. Lead 80 of conductive line 74 can in turn be connected to lead 82 of conductive line 84 on PCB 30 by wire 86. Lead 90 of conductive line 84 can be connected to lead 92 of conductive line 94 on PCB 42 by wire 96. And lead 100 of conductive line 94 can be connected to lead 102 of peripheral line 62 by wire 104. Operations can be performed in region 106 where data line 50 crosses peripheral line 60 and in region 108 where data line 50 crosses peripheral line 62 so that the upper part of data line 50 is electrically connected to peripheral line 60 and so that the lower part of data line 50 is electrically connected to peripheral line 62. The result of these connections is that the two parts of line 50 on either side of the open in region 52 both receive signals from or provide signals to the signal circuitry for line 50 as if line 50 were continuous.

C. General Features

Figure 2:
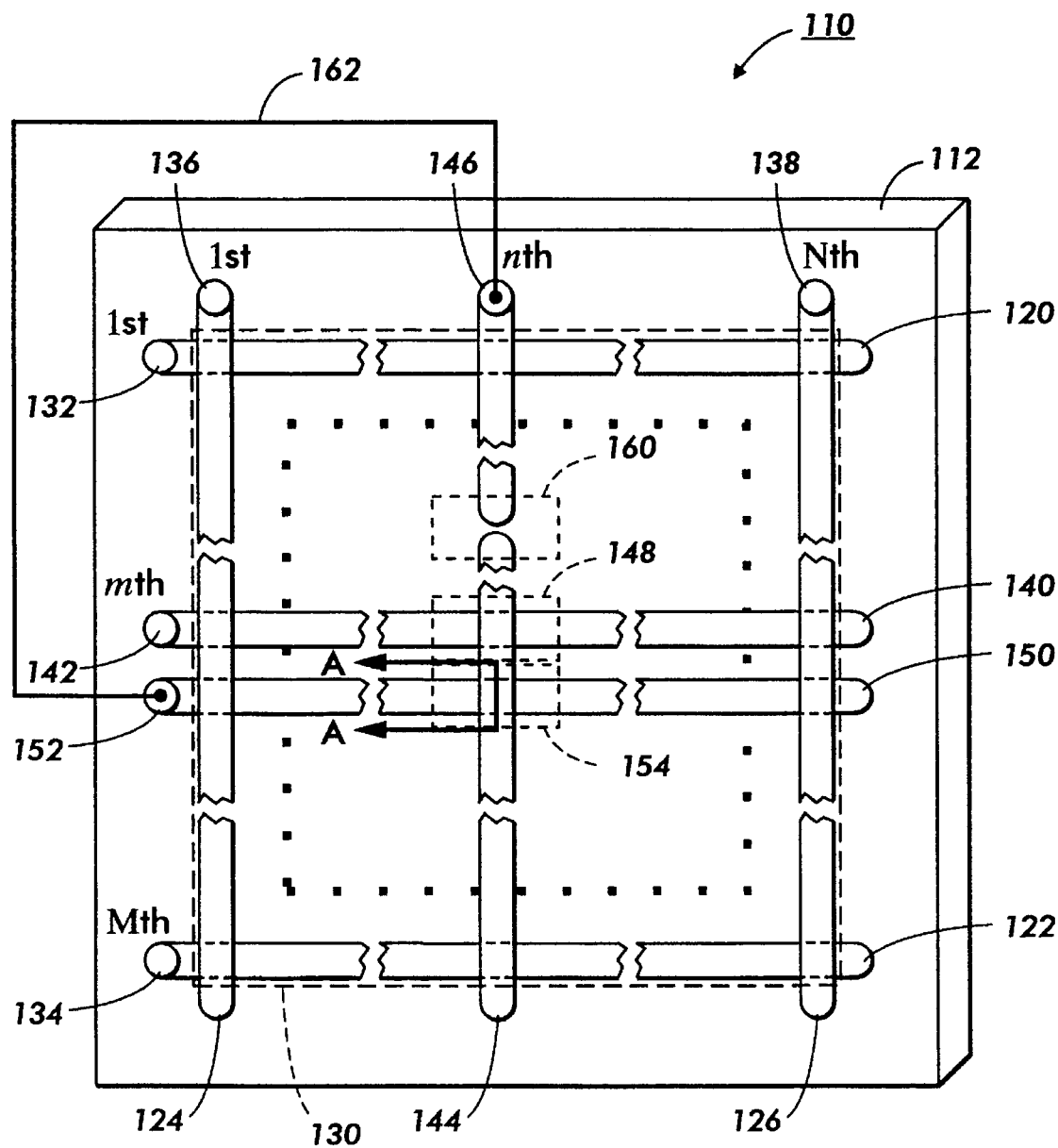
FIG. 2 is a schematic circuit diagram showing a repair structure with a repair line in an array region and with a connecting lead outside the array region.
Figure 3:
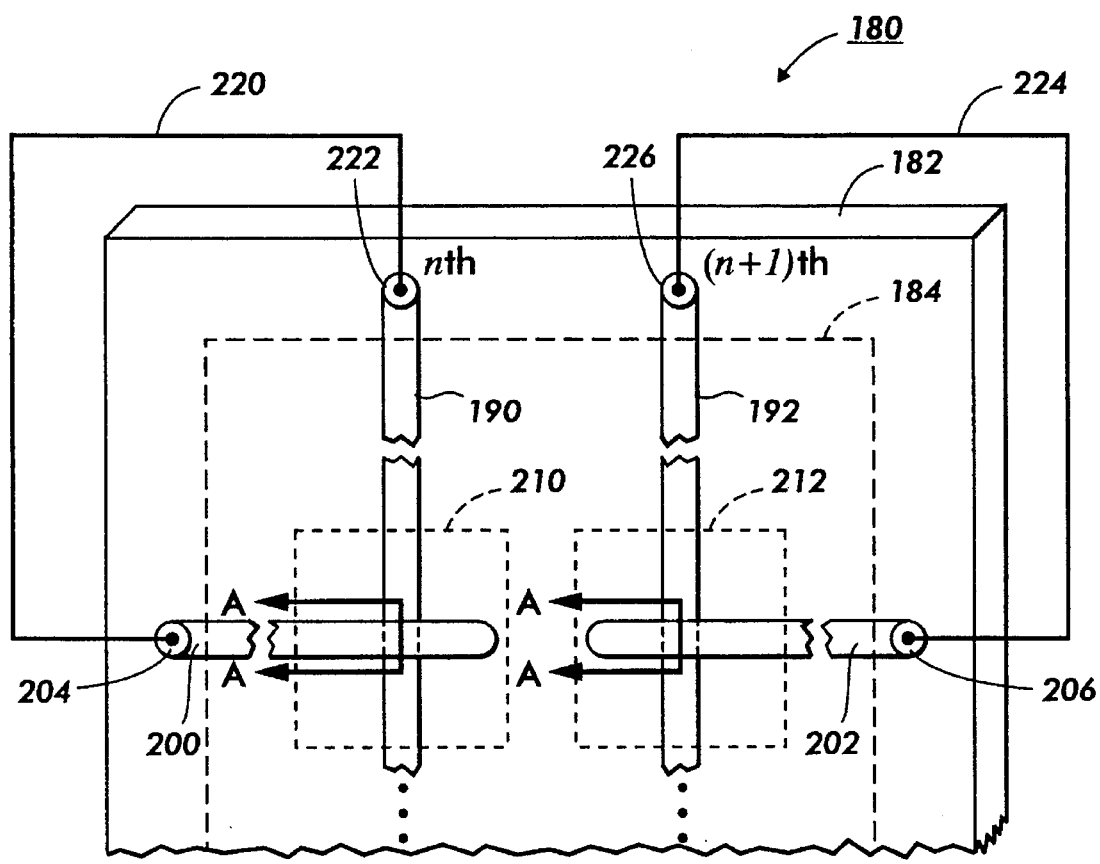
FIG. 3 is a schematic circuit diagram showing a repair structure with two collinear repair lines and connecting leads.
Figure 4:
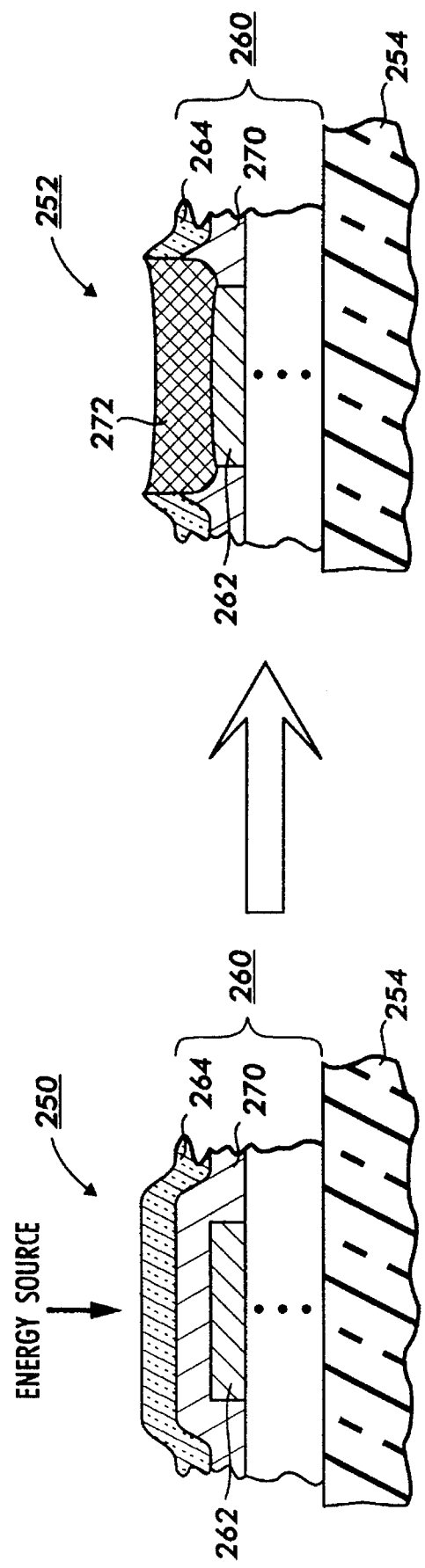
FIG. 4 is a schematic flow diagram showing cross sections along any of lines A—A in FIGS. 2 and 3 at successive stages in electrically connecting a repair line to a line it crosses by melting an insulating layer.
Figure 5:
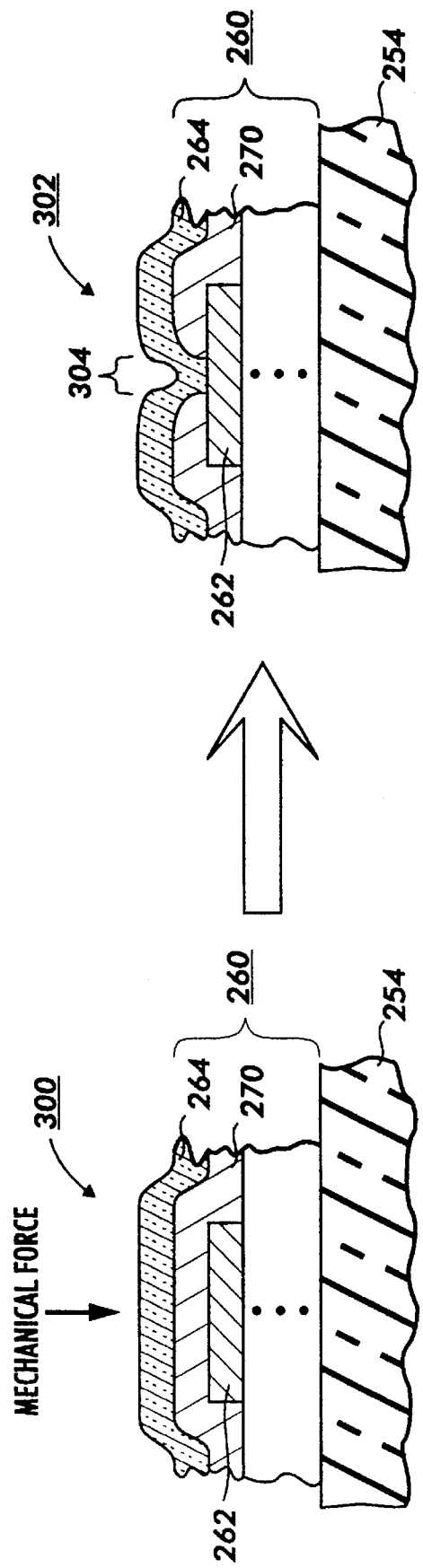
FIG. 5 is a schematic flow diagram showing cross sections along any of lines A—A in FIGS. 2 and 3 at successive stages in electrically connecting a repair line to a line it crosses by mechanically deforming an insulating layer to produce metal-to-metal contact.
Figure 6:
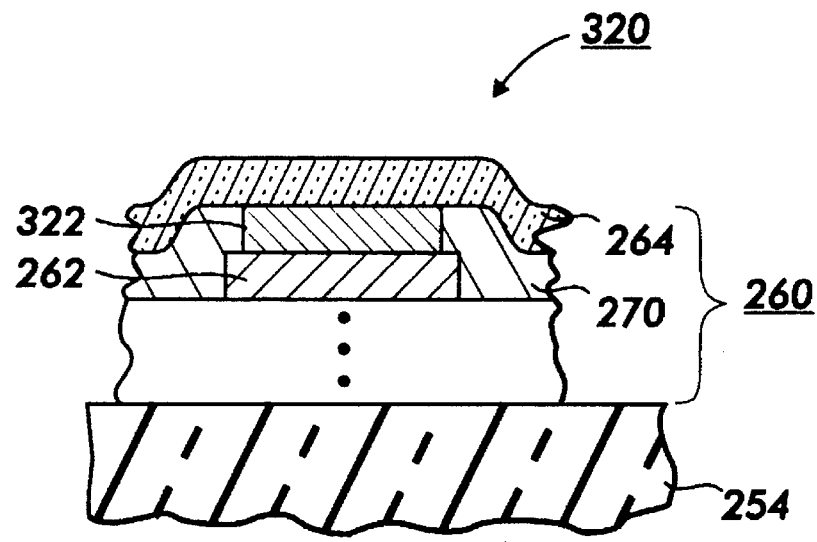
FIG. 6 is a cross section along any of lines A—A in FIGS. 2 and 3 with an electrical connection between a repair line and a line it crosses through a conductive part of an insulating layer.
Figure 7:
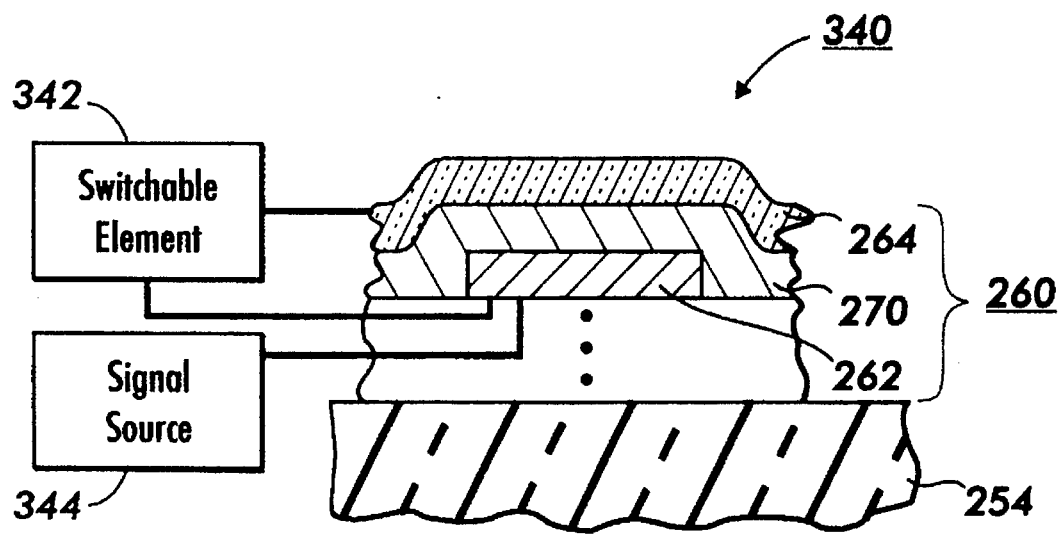
FIG. 7 is a cross section along any of lines A—A in FIGS. 2 and 3 with schematic circuitry that can provide signals to a switchable element to produce an electrical connection between a repair line and a line it crosses.
Figure 8:
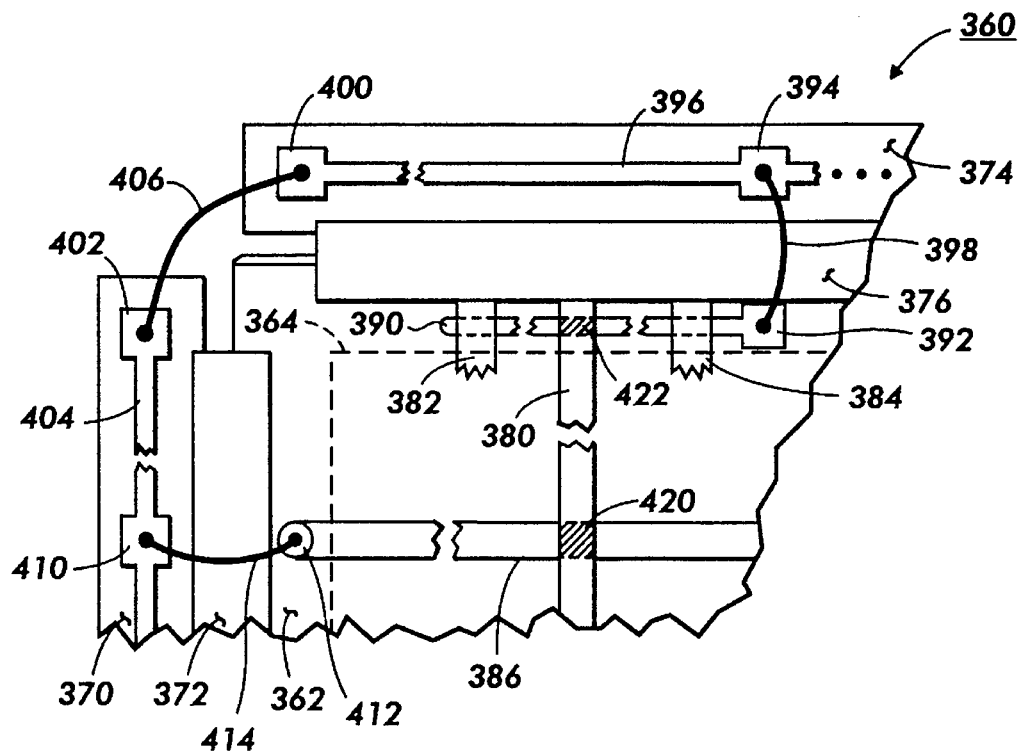
FIG. 8 is a schematic diagram showing a highly conductive line that is on a printed circuit board and is electrically connected between a repair line's connecting lead and an open line's signal circuitry through a peripheral line that crosses the open line.
Figure 9:
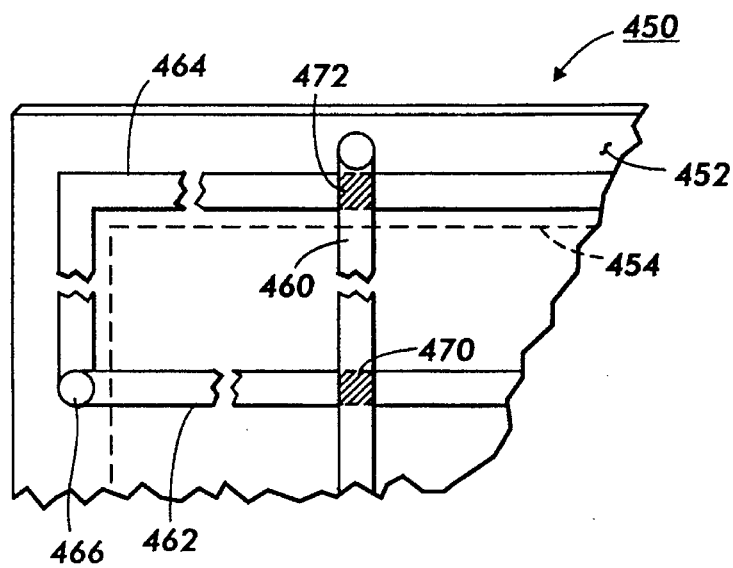
FIG. 9 is a schematic diagram showing a highly conductive line that is on the same substrate as an array and is electrically connected between a repair line's connecting lead and the signal circuitry of an open line that the highly conductive line crosses.
Figure 10:
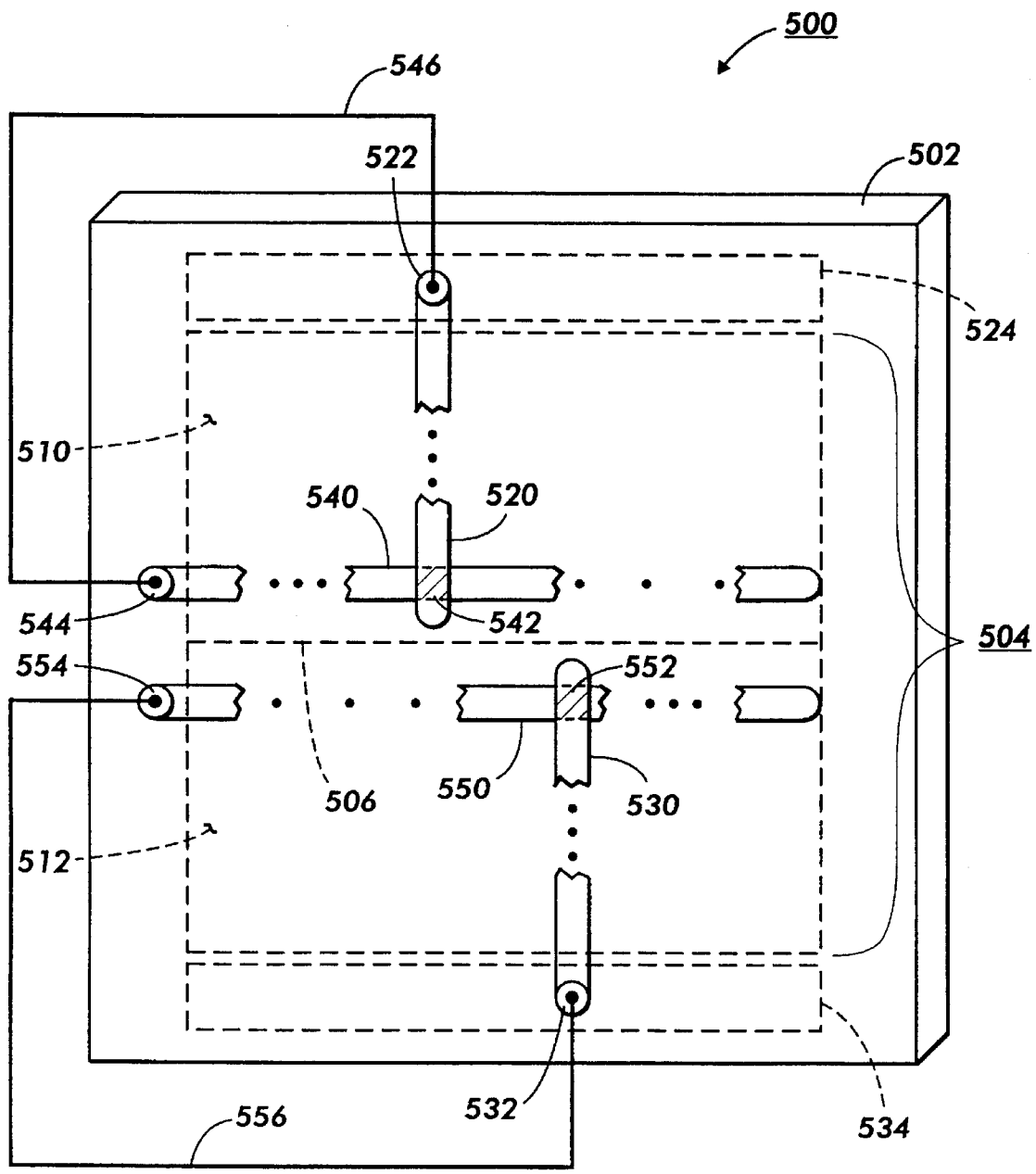
FIG. 10 is a schematic circuit diagram showing how a split array on a substrate can include two repair structures as in FIG. 2 or FIG. 3, with the repair lines along the split.
Figure 11:
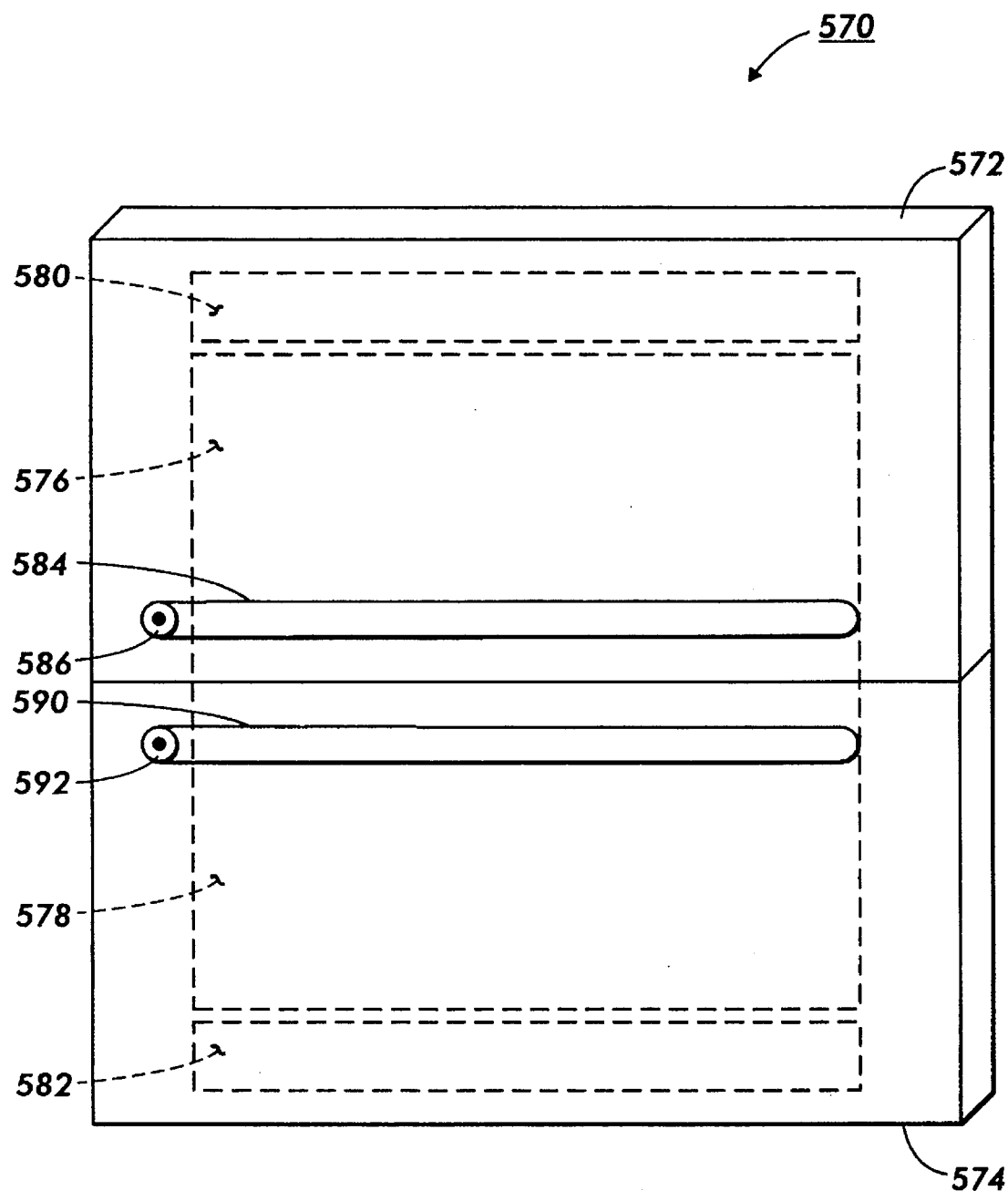
FIG. 11 is a schematic circuit diagram showing how a split array on two abutting substrates can include two repair structures as in FIG. 2 or FIG. 3, with the repair lines along the split.
Figure 12:
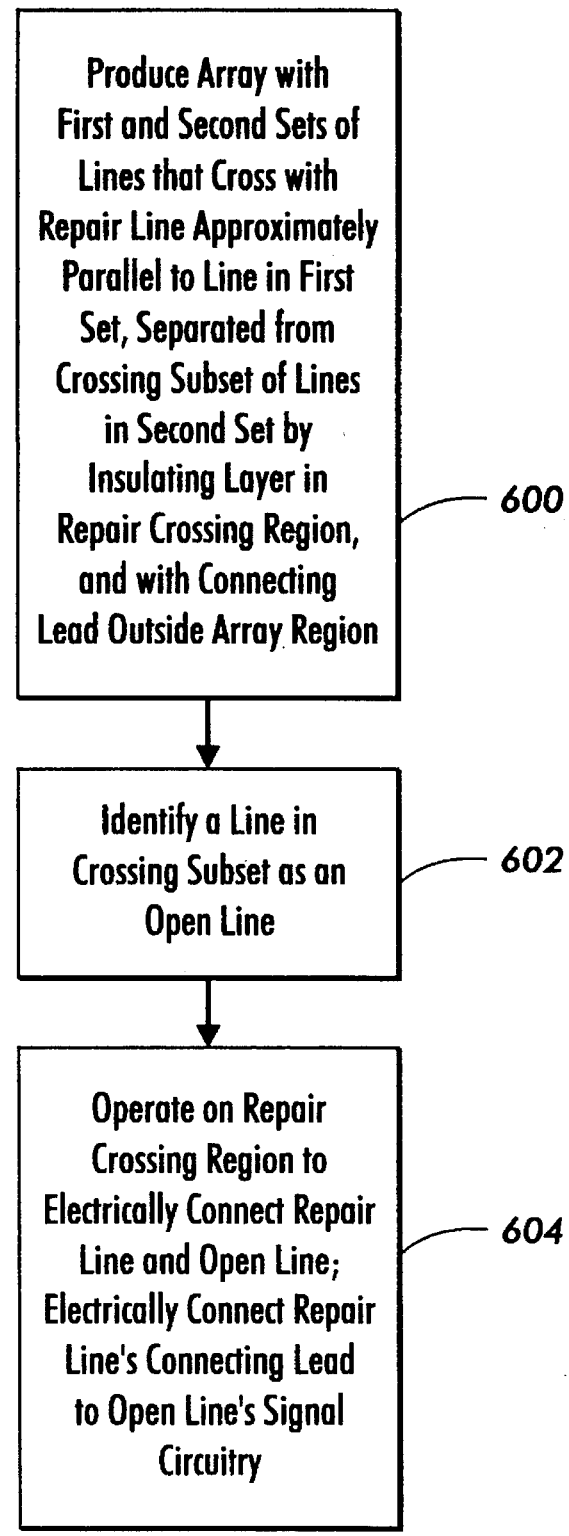
FIG. 12 is a flow chart showing general acts in producing an array in which a repair line as shown in FIG. 2 or FIG. 3 has been been used to repair an open.

FIGS. 2–12 show general features of the invention. FIG. 2 shows a repair structure with a repair line in an array region and with a connecting lead outside the array region. FIG. 3 shows a repair structure with two collinear repair lines and connecting leads. FIG. 4 shows stages in electrically connecting a repair line to a line it crosses by melting an insulating layer. FIG. 5 shows stages in electrically connecting a repair line to a line it crosses by mechanically deforming an insulating layer. FIG. 6 shows an electrical connection between a repair line and a line it crosses through a part of an insulating layer that has been made conductive. FIG. 7 shows circuitry that can provide an electrical connection between a repair line and a line it crosses by providing signals to a switchable element. FIG. 8 shows a highly conductive line on a printed circuit board, electrically connected between a repair line's connecting lead and the signal circuitry of an open line. FIG. 9 shows a highly conductive line on the same substrate as an array, electrically connected between a repair line's connecting lead and the signal circuitry of an open line. FIG. 10 shows a split array on a substrate, with a repair line in each part. FIG. 11 shows a split array on abutting substrates, with a repair line in each part. FIG. 12 shows general acts in producing a repaired array.

FIG. 2 shows article of manufacture 110 with substrate 112 on the surface of which circuitry is formed. The circuitry includes a first set of M lines 120 through 122 and a second set of N lines 124 through 126.

As shown, each of lines 120 through 122 crosses each of lines 124 through 126 in a crossing region within which the lines are insulated from each other. Array region 130 of the surface of substrate 112 includes all of the crossing regions.

Each of the first set of lines 120 through 122 is electrically connected to one of signal leads 132 through 134. Similarly, each of the second set of lines 124 through 126 is electrically connected to one of signal leads 136 through 138. Each line's signal lead can connect the line to signal circuitry from which the line receives signals or to which the line provides signals.

FIG. 2 shows mth line 140 in the first set, with signal lead 142, and nth line 144 in the second set, with signal lead 146, in more detail. As shown, mth line 142 and nth line 146 cross in (m, n)th crossing region 148.

FIG. 2 also shows a repair structure that includes repair line 150 and connecting lead 152. Repair line 150 is approximately parallel to mth line 140 within array region 130, crossing each of the second set of lines 124 through 126 within array region 130 and electrically connecting to connecting lead 52 outside of array region 130. In FIG. 2, repair line 150 is illustratively shown parallel to and alongside mth line 140. Repair line 150 and nth line 146 cross in nth repair crossing region 154, but are separated by an insulating layer such that an electrical connection can be formed between repair line 150 and nth line 146 by operating on nth repair crossing region 154.

FIG. 2 shows open region 160, a region of the surface of substrate 112 that is between signal lead 146 and nth repair crossing region 154. As shown, nth line 144 has an open in open region 160, which could result from an error in processing, for example, or from a repair that isolates a short between nth line 144 and one of the first set of lines that is between first line 132 and mth line 140.

Repair line 150 can be used to connect the portion of nth line 144 between open region 160 and nth repair crossing region 154 to the signal cricuitry for nth line 144. Repair line 50 and nth line 144 can be electrically connected by operating on nth repair crossing region 154. Then, as suggested by line 162 from connecting lead 152 to signal lead 146, repair line 150 can be connected to receive signals from or provide signals to the signal circuitry for nth line 144.

FIG. 3 shows article 180, which is generally similar to article 110 in FIG. 2, but with an alternative repair structure. A surface of substrate 182 includes array region 184 in which first and second sets of lines cross as in FIG. 2. The second set of lines includes nth line 190 and (n+1)th line 192, which are adjacent to each other.

The repair structure in FIG. 3 includes two collinear repair lines 200 and 202. As can be seen, repair line 200 crosses a subset of the second set of lines that includes the first line through nth line 190. Similarly, repair line 202 crosses a subset of the second set of lines that includes (n+1)th line 192 through the Nth line. The subsets of lines that are crossed by repair lines 200 and 202 are mutually exclusively and, together, they include all the lines in the second set. Repair line 200 is electrically connected to connecting lead 204 and repair line 202 is electrically connected to connecting lead 206. Connecting leads 204 and 206 are outside array region 184.

Repair line 200 and nth line 190 cross in nth repair crossing region 210, but are separated by an insulating layer such that an electrical connection can be formed between repair line 200 and nth line 190 by operating on nth repair crossing region 210. Similarly, repair line 202 and (n+1)th line 192 cross in (n+1)th repair crossing region 212, but are separated by an insulating layer such that an electrical connection can be formed between repair line 202 and nth line 192 by operating on nth repair crossing region 212. Each of repair lines 200 and 202 is similarly separated by an insulating layer from each of the other lines in its crossing subset.

If, for example, nth line 190 and (n+1)th line 192 each have an open, repair line 200 can be used to repair nth line 190 and repair line 202 can be used to repair (n+1)th line 192. Repair line 200 and nth line 190 can be electrically connected by operating on nth repair crossing region 210. Then, as suggested by line 220 from connecting lead 204 to signal lead 222, repair line 200 can be connected to receive signals from or provide signals to the signal circuitry for nth line 190. Similarly, repair line 202 and (n+1)th line 192 can be electrically connected by operating on (n+1)th repair crossing region 212. Then, as suggested by line 224 from connecting lead 206 to signal lead 226, repair line 202 can be connected to receive signals from or provide signals to the signal circuitry for (n+1)th line 192. The same technique could be used to repair an open in any other line in either repair line's subset, but each repair line can only be used to repair one line in its subset.

FIG. 4 shows cross sections 250 and 252, each of which could be taken along any of lines A—A in the repair crossing regions of FIGS. 2 or 3. Each cross section shows substrate 254 with thin film structure 260 formed on its surface. Structure 260 includes repair line 262 and open line 264, which cross in a repair crossing region. Structure 260 also includes, between repair line 262 and open line 264, insulating layer 270. Structure 260 as shown in cross section 250 can be referred to as an "anti-fuse."

Cross section 250 shows a stage at the beginning of a repair, with an energy source applying energy to the repair crossing region. The energy source could, for example, be a laser or another source of electromagnetic energy, an electrical source of thermal energy, or a chemical source of thermal energy. Cross section 252 shows a stage after repair, in which repair line 262 and open line 264 are electrically connected.

In cross section 252, melted part 272 results from the application of sufficient energy to melt insulating layer 270. Through the melted portion of insulating layer 270, molten material from open line 264, which may be metal, can mix with molten material from repair line 262, which may also be metal. Insulating layer 270 may also be partially vaporized, forming a crater that facilitates mixing of molten material from the two lines by permitting collapse of molten material from open line 264. After mixing, melted part 272 includes material both from open line 264 and from repair line 262. As a result, melted part 272 electrically connects open line 264 to repair line 262.

FIG. 5 shows cross sections 300 and 302, each of which could similarly be taken along any of lines A—A in the repair crossing regions of FIGS. 2 or 3. As in FIG. 4, each cross section shows substrate 254, thin film structure 260, repair line 262, open line 264, and insulating layer 270.

Cross section 300 shows a stage at the beginning of a repair, with a mechanical force being applied to the repair crossing region. The mechanical force could, for example, be applied by a very small pointed element vibrating at an ultrasonic frequency between 20 and 100 KHz to deform insulating layer 270, but with less likelihood of causing other faults than with a non-vibrating mechanical force. Cross section 302 shows a stage after repair, in which an opening has been formed in insulating layer 270 in region 304, which is within the repair crossing region. Metal from repair line 262 and metal from open line 264 contact each other through the opening to form an electrical connection.

FIG. 6 shows cross section 320, which could similarly be taken along any of lines A—A in the repair crossing regions of FIGS. 2 or 3. As in FIGS. 4 and 5, cross section 320 shows substrate 254, thin film structure 260, repair line 262, open line 264, and insulating layer 270.

Cross section 320 also shows part 322 of insulating layer 270 which has been made conductive, such as through electrochemical introduction of impurities or through other operations. Because part 322 is conductive, repair line 262 and open line 264 are electrically connected within their repair crossing region.

FIG. 7 shows cross section 340, which could similarly be taken along any of lines A—A in the repair crossing regions of FIGS. 2 or 3. As in FIGS. 4–6, cross section 340 shows substrate 254, thin film structure 260, repair line 262, open line 264, and insulating layer 270.

FIG. 7 also shows schematically how switchable element 342 could be electrically connected between repair line 262 and open line 264. Signal source 344 connected to repair line 262 can provide electrical signals to the repair crossing region so that switchable element 342 is switched to a conductive state to form an electrical connection between repair line 262 and open line 264. Switchable element 342 could, for example, be a transistor that can be made permanently ON by a high voltage, or it could be a material such as a LeComber switch that makes a transition from an insulating to a conductive state when a high voltage is applied. An amorphous silicon switching device of this type is described Owen, A. E., Le Comber, P. G., Spear, W. E., and Hajto, J., "Memory Switching in Amorphous Silicon Devices," *Journal of Non-Crystalline Solids,* Vols. 59 & 60, 1983, pp. 1273–1280.

In addition to an electrical connection between the repair line and an open line it crosses in a repair crossing region, another electrical connection is necessary before the open line can receive or provide signals as though it were continuous. The other electrical connection is between the repair line's connecting lead and the signal circuitry for the open line. This electrical connection can be made by an appropriate highly conductive line outside the array region.

FIG. 8 shows one type of electrical connection between a repair line's connecting lead and the signal circuitry for an open line. The electrical connection in FIG. 8 resembles the electrical connection used in the repair technique illustrated in FIG. 1, above.

Article 360 in FIG. 8 includes substrate 362 with a surface that includes array region 364 in which two sets of lines cross as described above. PCB 370 provides connections to a first set of lines through TAB structure 372 along the edge of substrate 362, and PCB 374 provides connections to a second set of lines through TAB structure 376, also along the edge of substrate 362.

Open line 380, shown in greater detail, is one of a subset of lines 382 through 384 and also is one of another, possibly different subset of lines that cross repair line 386 in a repair crossing region. Peripheral line 390 crosses each of lines 382 through 384 outside array region 364 near TAB structure 376.

FIG. 8 shows that lead 392 of peripheral line 390 can be connected to lead 394 of conductive line 396 on PCB 374 by wire 398. Lead 400 of conductive line 396 can in turn be connected to lead 402 of conductive line 404 on PCB 370 by wire 406. Lead 410 of conductive line 404 can be connected to lead 412 of repair line 386 by wire 414. Operations can be performed in region 420 where repair line 386 and open line 380 cross and in region 422 where open line 380 and peripheral line 390 cross so that the upper part of open line 380 is electrically connected to peripheral line 390 and so that the lower part of open line 380 is electrically connected to repair line 386. As a result of these connections, conductive lines 396 and 404 are electrically connected between connecting lead 412 of repair line 386 and the signal circuitry of open line 380 so that the two parts of open line 380 both receive signals from or provide signals to the signal circuitry for open line 380 as if open line 380 were continuous.

FIG. 8 shows connections from leads on substrate 362 to leads on PCBs 370 and 374 by way of wires, but connections could instead by provided through TAB structures 372 and 376. In addition, rather than overlapping TAB structures 372 and 376, other structures such as regular TAB or chip on glass could be used to connect components on PCBs 370 and 374 to circuitry on substrate 362. Conductive lines 396 and 404 could be implemented using copper or other highly conductive metals. Instead of two distinct PCBs 370 and 374, a single PCB extending around the entire edge of substrate 362 might be used, eliminating the need for wire 406 between leads 400 and 402 and similar wires at the other corners of substrate 362.

FIG. 9 shows an alternative electrical connection between a repair line and an open line's signal circuitry. The electrical connection in FIG. 9 does not require highly conductive lines external to the substrate that holds the array circuitry.

Article 450 in FIG. 9 includes substrate 452 with a surface that includes array region 454 in which two sets of lines cross as described above. Open line 460, shown in greater detail, is one of a subset of the second set of lines that each cross repair line 462 in a repair crossing region. Peripheral line 464 is a highly conductive line outside the boundary of array region 454, electrically connected to repair line 462 at connecting lead 466 and crossing each of the subset of lines that cross repair line 462 outside array region 454.

Open line 460 is electrically connected to signal lead 468 for electrically connecting to its signal circuitry.

Operations can be performed in region 470 where repair line 462 and open line 460 cross and in region 472 where open line 460 and peripheral line 464 cross so that the upper part of open line 460 is electrically connected to peripheral line 464 and so that the lower part of open line 460 is electrically connected to repair line 462. As a result of these connections, peripheral line 464 is electrically connected between connecting lead 466 of repair line 462 and the signal circuitry of open line 460.

Peripheral line 464 could be implemented with metals as described above in relation to FIG. 8, and must have sufficient conductivity that the delay it introduces is small in relation to the relevant time constant of the array. The technique of FIG. 9 is appropriate for an array in which all of the lines in the second set have their signal leads along one side of array region 454; repair line 462 could be along the opposite side of array region 454 from the signal leads, so that an open occurring anywhere between the signal leads and the opposite side of array region 454 can be repaired.

FIGS. 10 and 11 illustrate two ways in which repair structures as described above could be used in a split array. Each split array includes two array regions, both of which can be of the same size.

FIG. 10 shows article 500, which is generally similar to article 110 in FIG. 2 and article, but with a split array and two repair structures. A surface of substrate 502 includes array region 504, which is divided along split line 506 into upper array region 510 and lower array region 512.

First and second sets of lines cross in upper array region 510 as in FIG. 2, with the first set extending in a first direction and the second set extending in a second direction different than the first. FIG. 10 shows open line 520, one of the second set that is electrically connected to signal lead 522 in peripheral region 524 along an upper side of upper array region 510. Peripheral region 524 also includes signal leads of the other lines in the second set.

Third and fourth sets of lines cross in lower array region 512, again as in FIG. 2, with the third set extending in the first direction and the fourth set extending in the second. FIG. 10 shows open line 530, one of the fourth set that is electrically connected to signal lead 532 in peripheral region 534 along a lower side of lower array region 512. Peripheral region 534 also includes signal leads of the other lines in the fourth set.

The side of upper array region 510 opposite peripheral region 524 is adjacent to the side of lower array region 512 opposite peripheral region 534. Array regions 510 and 512 together form a split array. The lines of the second set can be collinear with the lines of the fourth set, with an open at split line 506.

FIG. 10 also shows two repair structures, one each in array regions 510 and 512. The upper repair structure in FIG. 10 includes repair line 540, which can be electrically connected to open line 520 in region 542 where the lines cross. Connecting lead 544 can then be connected to signal circuitry for open line 510, as illustrated by line 546, so that open line 520 receives signals from or provides signals to its signal circuitry as if it were continuous. Similarly, the lower repair structure in FIG. 10 includes repair line 550, which can be electrically connected to open line 530 in region 552 where the lines cross. Connecting lead 554 can then be connected to signal circuitry for open line 530, as illustrated by line 556, so that open line 530 receives signals from or provides signals to its signal circuitry as if it were continuous.

As suggested in FIG. 10, repair lines 540 and 550 can be along the adjacent sides of array regions 510 and 520. The first and second directions can be perpendicular, with the repair lines extending in the first direction.

FIG. 11 shows article 570, similar to article 500 in FIG. 10 but with two substrates 572 and 574. A surface of substrate 572 includes upper array region 576, and a surface of substrate 574 includes lower array region 578. Array regions 576 and 578 include sets of lines that cross as in array regions 510 and 512 in FIG. 10, with signal leads in peripheral regions 580 and 582 on substrates 572 and 574 respectively.

The side of upper array region 576 opposite peripheral region 580 is at an edge of substrate 572, and the edge abuts an edge of substrate 574 at the side of lower array region 578 opposite peripheral region 582. Array regions 576 and 578 together form a split array.

FIG. 11 also shows two repair structures, one each in array regions 576 and 578. The upper repair structure in FIG. 11 includes repair line 584, which can be electrically connected to an open line in a repair crossing region. Connecting lead 586 can then be connected to signal circuitry for the open line as in FIG. 10. Similarly, the lower repair structure in FIG. 11 includes repair line 590, which can be electrically connected to an open line in a repair crossing region. Connecting lead 592 can then be connected to signal circuitry for the open line as in FIG. 10.

Split arrays as in FIGS. 10 and 11 may be especially advantageous for display arrays, in which scan lines may extend parallel to the split and data lines may be split between the parts of the array. As a result, the time available for providing drive signals to each data line is greater, so that a larger display may be feasible. The split array could be scanned in an appropriate way, such as from the upper and lower edges toward the center or vice versa.

FIG. 12 shows general acts in producing a repaired array using a repair line like those described above.

The act in box 600 begins by producing array circuitry on a surface of a substrate. The array circuitry includes first and second sets of lines that cross in an array region and, also in the array region, a repair line approximately parallel to at least one of the lines in the first set. The repair line has a connecting lead outside the array region. The repair line crosses each of a subset of lines in the second set in a repair connecting region, with the repair line and crossing line separated by an insulating layer, as described above.

The act in box 602 identifies an open line in the crossing subset. The act in box 602 could, for example, test the lines in the crossing subset for opens resulting from fabrication, or the act in box 602 could create one or two opens in a line in the crossing subset to isolate it from a short to one of the lines in the first set.

The act in box 604 operates on the repair connecting region where the repair line crosses the open line, electrically connecting the lines. The act in box 604 also electrically connects the repair line's connecting lead to the open line's signal circuitry. As a result, the open line can receive signals from or provide signals to its signal circuitry as if it were continuous, despite the presence of an open.

D. Implementation

The general features described above could be implemented in numerous ways for a variety of applications. For example, the general features could be implemented using nearly any conventional AMLCD technology, but adding one or more repair structures within the array region so that a repair can be made as described above. The implementation described below can be made using AMLCD technology described in copending coassigned U.S. patent application No. 08/235,011, now issued as U.S. Pat. No. 5,491,347 entitled "Thin-Film Structure With Dense Array of Binary Control Units for Presenting Images" ("the Dense Array Application") incorporated herein by reference.

D.1. Layout

Figure 13:
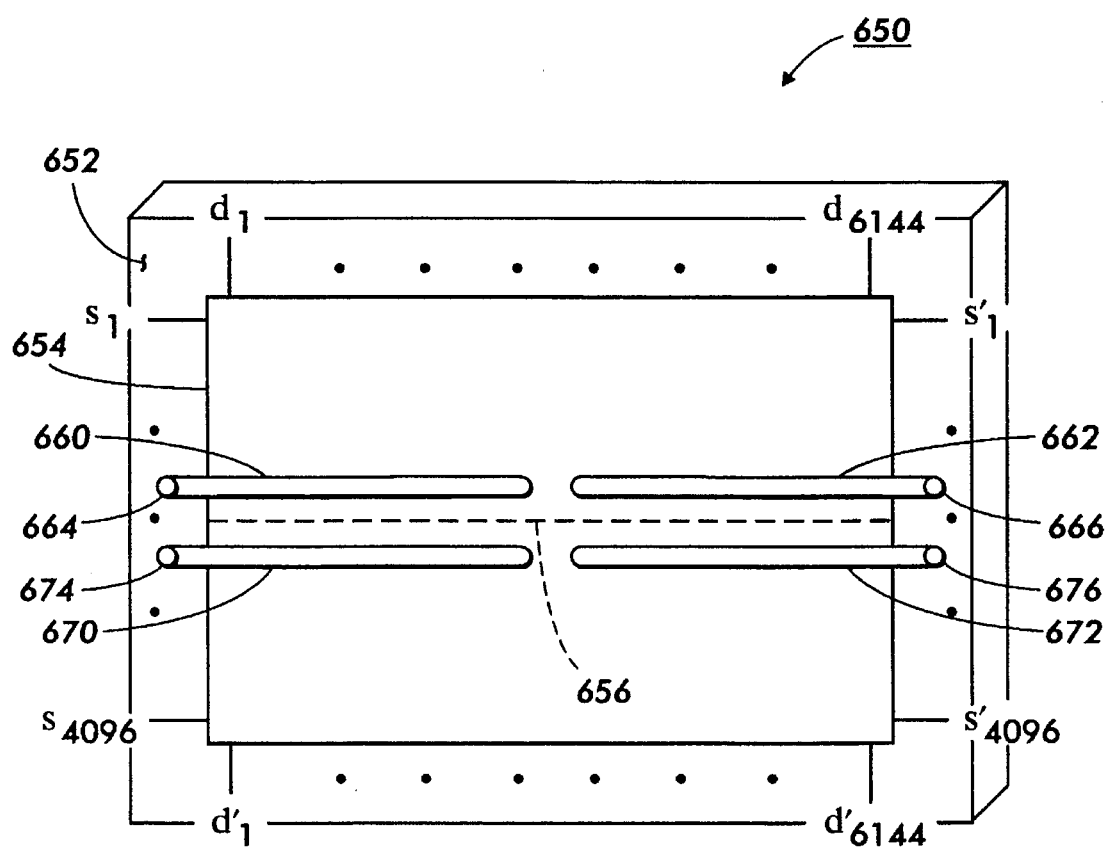
FIG. 13 is a schematic diagram showing a 4096×6144 split array with two repair structures, each with two repair lines along a split line.
Figure 14:
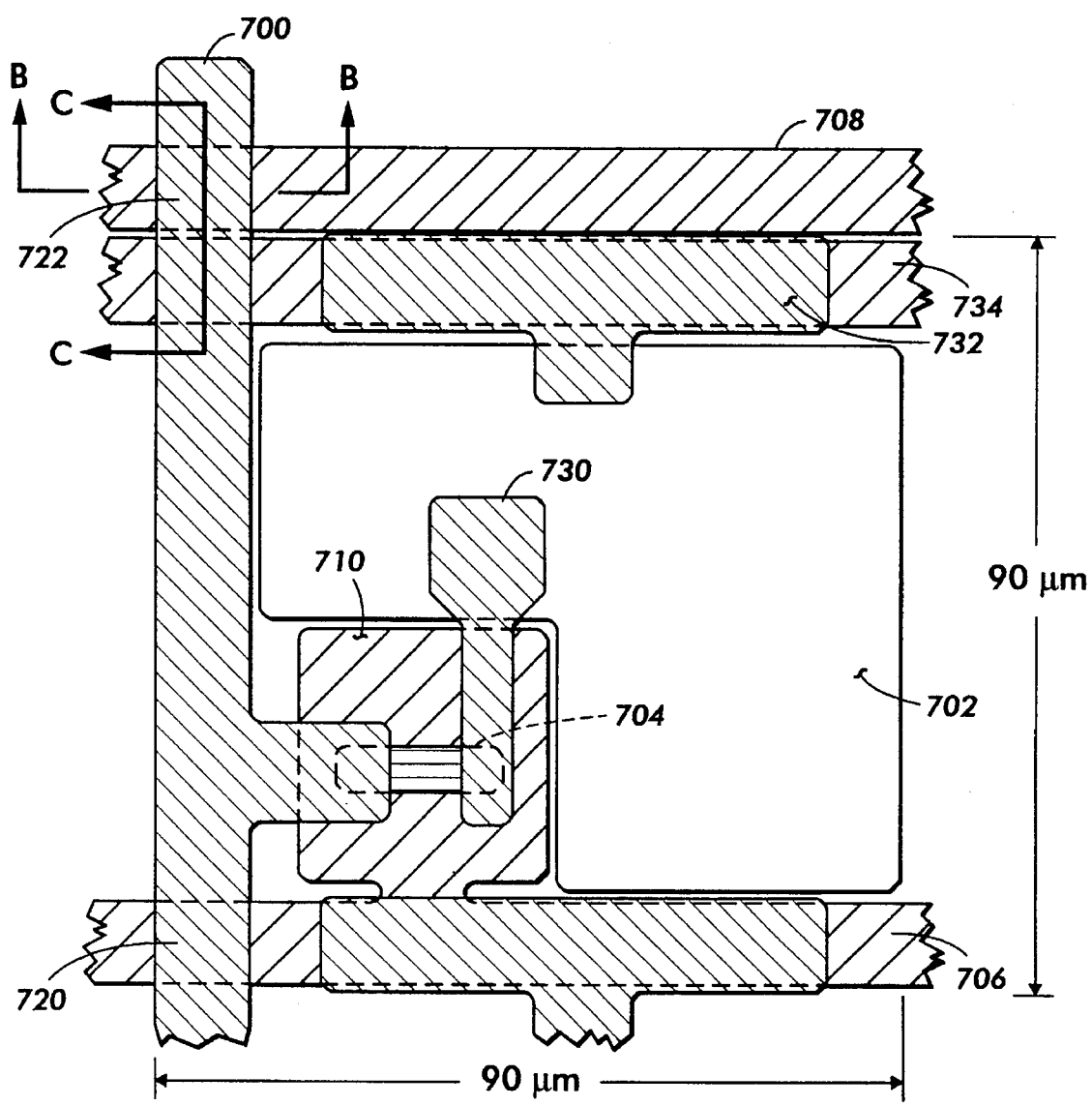
FIG. 14 is a schematic layout diagram showing a cell in the array of FIG. 13 in which a repair lines is parallel to and alongside a scan line.
Figure 15:
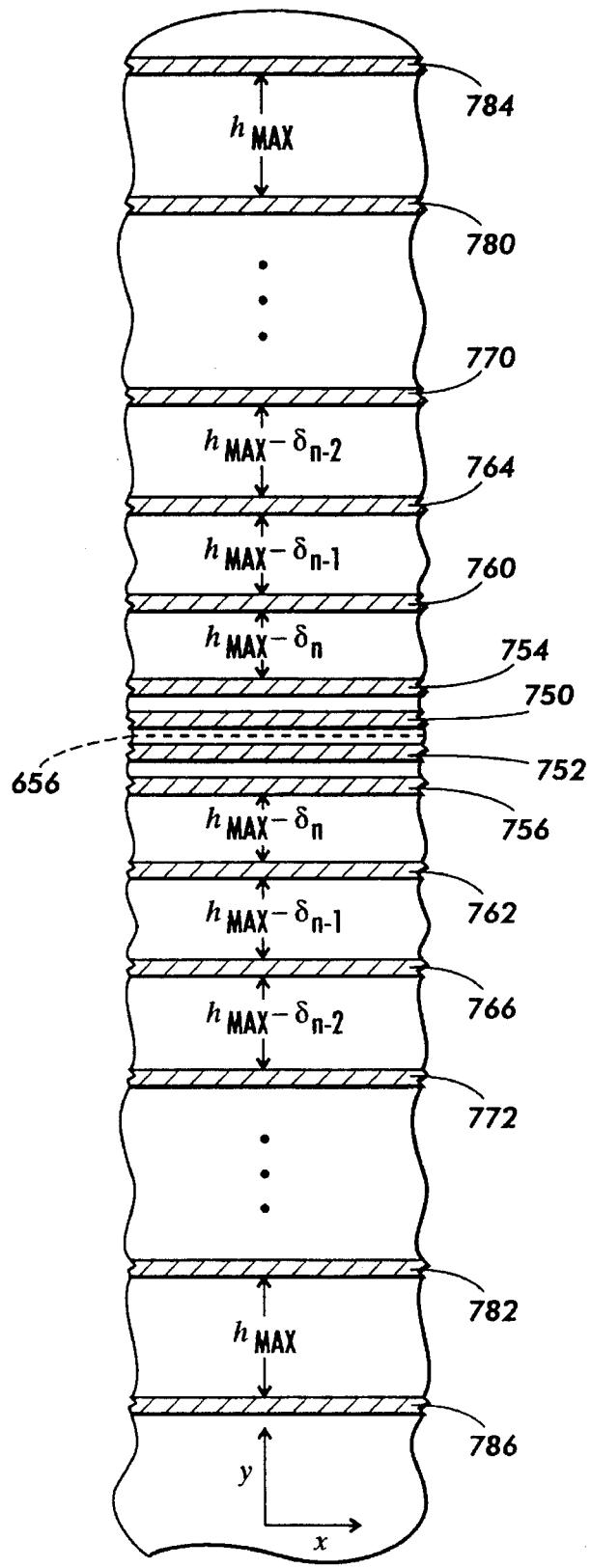
FIG. 15 is a schematic layout diagram showing sizes of rows of light control units near the split line in the array of FIG. 13.

FIGS. 13–15 show features of a layout of a split array. FIG. 13 shows layout of array circuitry on a substrate. FIG. 14 shows layout of a cell that is crossed by a repair line. FIG. 15 shows spacings between lines in the bottom metal pattern that includes gate lines and repair lines.

Display array 650 in FIG. 13 includes substrate 652, which can be a transparent glass sheet as described in relation to FIG. 7 of the Dense Array Application. Array region 654 on the surface of substrate 652 is split into upper and lower array regions along split line 656. 4096 scan lines, with signal leads $s_1$ through $s_{4096}$ on the left and with signal leads $s'_1$ through $s'_{4096}$ on the right, extend across array region 654, with 2048 scan lines above split line 656 and 2048 below. 6144 data lines, extend across each part of array region 654 with the data lines above split line 656 having signal leads $d_1$ through $d_{6144}$ at the upper side and with the data lines below split line 656 having signal leads $d'_1$ through $d'_{6144}$ at the lower side and with the data lines above and below split line 656 collinear.

The circuitry in array region 654 also includes two repair structures with features as described above in relation to FIG. 3. The upper repair stucture is along the upper side of split line 656, and includes repair lines 660 and 662 in array region 654 and connecting leads 664 and 666 outside array region 654. The lower repair structure is along the lower side of split line 656, and includes repair lines 670 and 672 in array region 654 and connecting leads 674 and 676 outside array region 654.

FIG. 14, which is a modified version of FIG. 3 of the Dense Array Application, shows a layout for a light control unit. FIG. 14 shows several layers, with upper layers that are farthest from the substrate's surface obscuring lower layers. The uppermost layer shown in FIG. 14 is a top metal layer, which forms data line 700 connected to a channel lead of an amorphous silicon (a-Si) transistor that switches the light control unit; the top metal layer also forms several other features described below. The next layer shown is a layer of indium-tin-oxide (ITO), which forms transparent electrode 702. The next layer is a top nitride layer, which forms insulating island 704, part of the transistor; the top nitride is an insulating layer that can form other features as mentioned below. The lowest layer shown is a bottom metal layer, which forms gate line 706, repair line 708, and, connected to gate line 706, gate lead 710, which serves as the gate lead of the transistor.

Data line 700 provides a data signal to a column of light control units, one of which is shown in FIG. 14. The part of data line 700 that extends over gate lead 710 connects to one channel lead of the transistor. Gate line 706 similarly provides a scan signal to a row of light control units.

Data line 700 and gate line 706 are illustratively each 10 μm wide, and repair line 708 can be of approximately the same width, as shown. Data line 700 crosses over gate line 706 in crossover region 720 and over repair line 708 in repair crossing region 722. Crossover region 720 and repair crossing region 722 can each include an insulator formed by the top nitride layer and other features as necessary to ensure that the lines conduct signals adequately and that signals in the lines do not interfere.

Transparent electrode 702 connects to the other channel lead of the transistor through line 730, formed by the top metal layer. Therefore, when the transistor is conductive due to a scan signal provided to gate lead 710 by gate line 706, transparent electrode 702 receives and stores a drive signal from data line 700 through line 730.

Transparent electrode 702 also connects to charging lead 732, which implements one electrode of a storage capacitor and is formed by the top metal layer. Gate line 734, formed by the bottom metal layer, implements the other electrode of the storage capacitor; gate line 734 also provides a scan signal to the next light control unit in the same column.

The light control unit shown in FIG. 14 is square, and an array of identical light control units would have effective widths in the row and column directions of 90 μm×90 μm.

The patterned layers shown in FIG. 14 can be produced using the technique described in relation to FIG. 4 of the Dense Array Application. The bottom metal pattern can include repair line 708 and can also include peripheral lines that cross data lines outside the array region as described above in relation to FIGS. 1 and 8.

FIG. 15 shows part of the layout of the bottom metal pattern along split line 656 in greater detail. Along split line 656 are repair lines 750 and 752. Parallel to and alongside repair lines 750 and 752 are scan lines 754 and 756, respectively.

Each of the light control units could be laid out as illustrated in FIG. 14, with the rows above split line 656 rotated 180°. In this case, scan lines 760 and 762 control the first rows of light control units along split line 656, while scan lines 754 and 756 are dummy scan lines, not themselves providing scan signals but necessary to provide capacitor electrodes for the first rows of light control units. Scan lines 764 and 766 control second rows of light control units bounded on the opposite side by scan lines 760 and 762, respectively. Scan lines 770 and 772 similarly control third rows of light control units bounded on the opposite side by scan lines 764 and 766, respectively; scan lines 780 and 782 control nth rows of light control units; and scan lines 784 and 786 control (n+1)th rows of light control units bounded on the opposite side by scan lines 780 and 782.

Alternatively, the light control units in the first rows along split line 656 could be laid out with repair lines along the scan lines that drive the first rows, in which case scan lines 754 and 756 control the first rows of light control units; scan lines 760 and 762 control the second rows; scan lines 764 and 766 control the third rows; and so forth.

FIG. 15 shows sizes in the y-direction of rows of light control units between adjacent lines in the bottom metal pattern. The sizes shown can either indicate the actual spacing in the y-direction between adjacent lines or the aperture size in the y-direction that, when taken with the actual aperture size in the x-direction, would produce the actual aperture area of each light control unit between the lines. In either case, the sizes are such that a human viewer with normal vision viewing display array 650 at usual viewing distances cannot perceive a difference between single lines such as lines 760, 762, 764, 766, 770, 772, 780, 782, 784, and 786 on the one hand and, on the other hand, grouped lines such as lines 750, 752, 754, and 756.

The size of the row of light control units between adjacent lines 780 and 784 and between adjacent lines 782 and 786 is $h_{MAX}$, the largest size that occurs in the array. As explained above, 2n rows of light control units are between lines 780 and 782, n above split line 656 and n below. The rows next to split line 656, referred to above as the first rows, have a size of $(h_{MAX}-\delta_n)$, the smallest size shown. The second rows have a size of $(h_{MAX}-\delta_{n-1})$, the third rows $(h_{MAX}-\delta_{n-1})$, and so forth until the nth rows have a size of $(h_{MAX}-\delta_1)$. If the centers of lines 780 and 782 are spaced by exactly $2n(h_{MAX}+h_{LINE})$, assuming $h_{LINE}$ to be the width of each line, then $2n(h_{MAX}+h_{LINE})=(2n+2)h_{LINE}+(2nh_{MAX}-2\Sigma\delta_i)$ for i from 1 through n.

Therefore, $h_{LINE}=\Sigma\delta_i$, so that the total of the $\delta_i$ on each side of split line 656 is the same as one line width.

The $\delta_i$ should increase monotonically from $\delta_1$ through $\delta_n$. If the $\delta_i$ increase by equal increments $\Delta=\delta_1$, then $\Sigma\delta_i=(n^2+n)\Delta$ and we obtain $\delta_i=i\Delta=(ih_{LINE})/(n^2+n)$. For the layout of FIG. 14, $h_{LINE}=10$ μm and $h_{MAX}=80$ μm, so that if n=10, for example, then $\Delta=0.09$ μm, and the smallest size $(h_{MAX}-\delta_n)=70.1$ μm. Although the difference between light control units of 80 μm and light control units of 70.1 μm might be perceptible if they were juxtaposed, when the transition between them is in increments of 0.09 μm, perceptibility is decreased.

On the other hand, if the minimum mask resolution is 0.5 μm, the increments can be no smaller than 0.5 μm. For the situation where increments are constrained by minimum mask resolution, it may be preferable to step the $\delta_i$ by equal increments $\Delta=\delta_1$ after groups of rows, such as after each 10th row. In this and similar situations, larger values of n may be appropriate, such as n=100. This approach spreads the difference over a larger area, which may also decrease perceptibility.

To avoid perceptible artifacts due to off-centered light control units, each single line or group of lines can be centered on the appropriate position and the apertures of the light control units can be adjusted.

The approach of FIG. 15, with four lines grouped along split line 656, may work best with light control units that have large aperture areas and are separated by relatively narrow lines, because the proportional difference between adjacent rows of light control units will be relatively small. For light control units separated by relatively wide lines, it may be preferable to move the repair line a row away from split line 156, leaving three pairs of lines rather than a group of four lines, although this may result in some additional capacitance with the repair lines.

D.2. Structure

Figure 16:
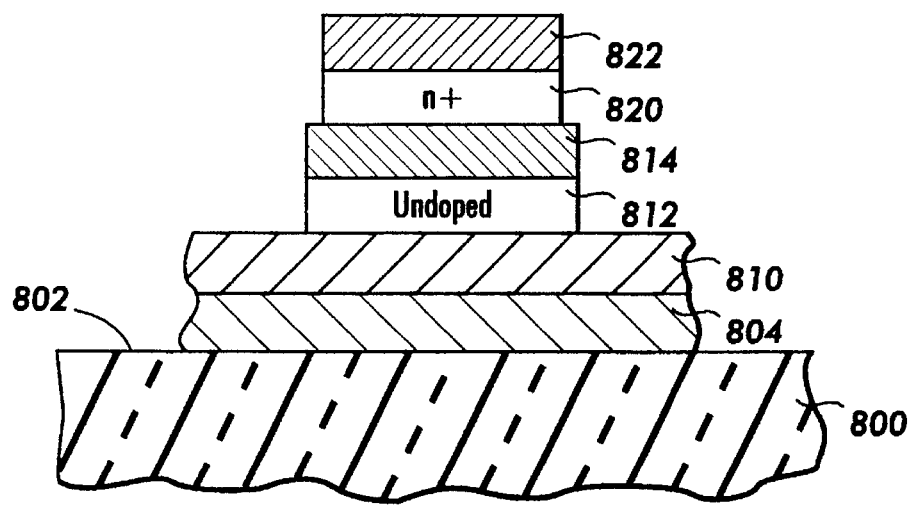
FIG. 16 is a cross sectional view along the line B—B in FIG. 14.
Figure 17:
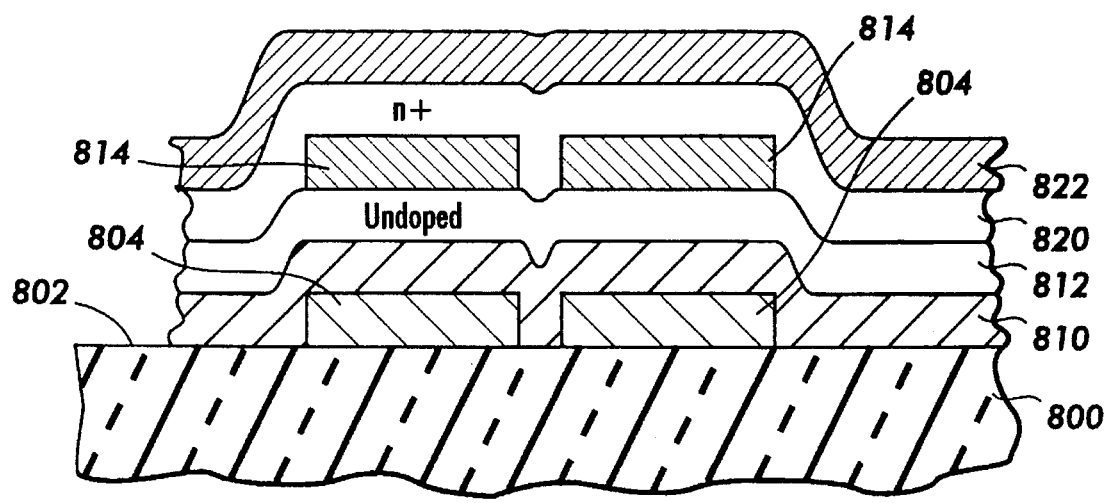
FIG. 17 is a cross sectional view along the line C—C in FIG. 14.

FIGS. 16 and 17 show features of a structure laid out as described above. FIG. 16 shows a cross section along line B—B in FIG. 14. FIG. 17 shows a cross section along line C—C in FIG. 14. The cross sections in FIGS. 16 and 17 can be understood more fully from copending coassigned U.S. patent application No. 08/234,885, now issued as U.S. Pat. No. 5,486,939 entitled "Thin-Film Structure With Insulating and Smoothing Layers Between Crossing Conductive Lines" ("the Crossing Lines Application"), incorporated herein by reference. The structure shown in FIGS. 16 and 17, which are similar respectively to FIGS. 8 and 9 of the Crossing Lines Application, can be produced using the process in FIG. 7 of the Crossing Lines Application, which is substantially the same as FIG. 4 of the Dense Array Application. Layers of the same material are similarly shaded and bear the same reference number in the two drawings.

Substrate 800 has surface 802 at which a thin-film structure is formed, beginning with bottom metal layer 804. FIG. 16 shows part of bottom metal layer 804 in repair line 708 in FIG. 14, while FIG. 17 shows repair line 708 at right and scan line 734 at left. Over bottom metal layer 804 is bottom nitride layer 810, followed by undoped amorphous silicon layer 812. Over amorphous silicon layer 812 is top nitride layer 814. Over top nitride layer 814 where it exists and over amorphous silicon layer 812 elsewhere is n+ amorphous silicon layer 820. Over n+ layer 820 is top metal layer 822. Over top metal layer 822 and other exposed layers can be a passivation layer (not shown).

Additional features of the structure in FIGS. 16 and 17 can be understood from the description in the Crossing Lines Application.

D.3. Test and Repair

Figure 18:
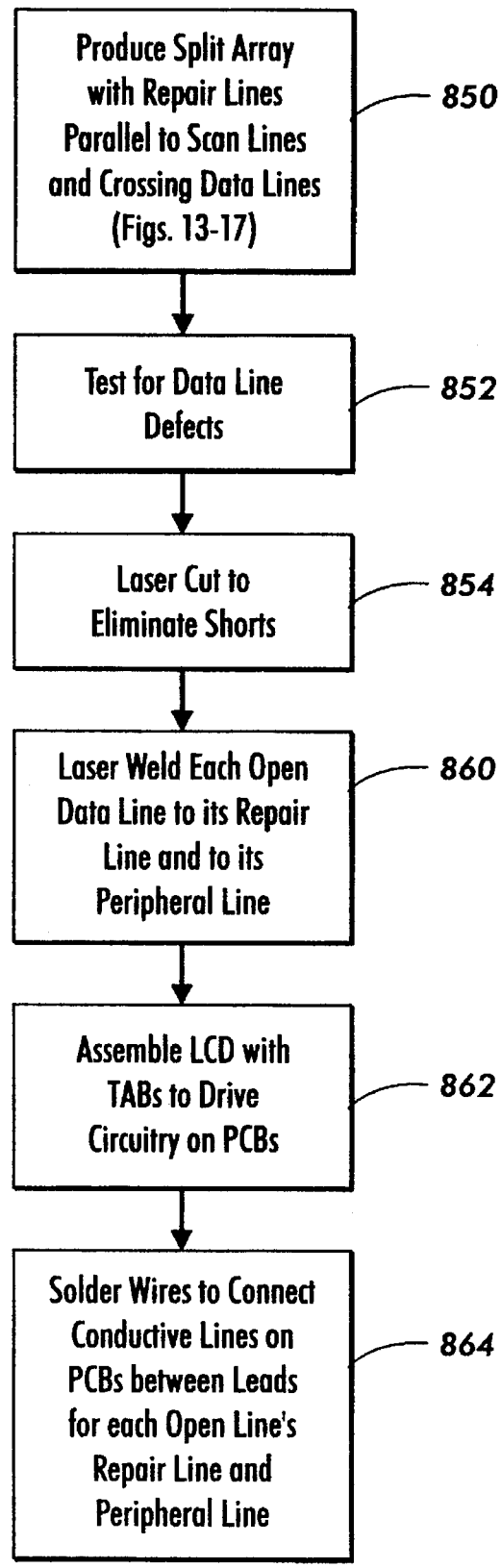
FIG. 18 is a flow chart showing acts in repairing open data lines in the array of FIG. 13.
Figure 19:
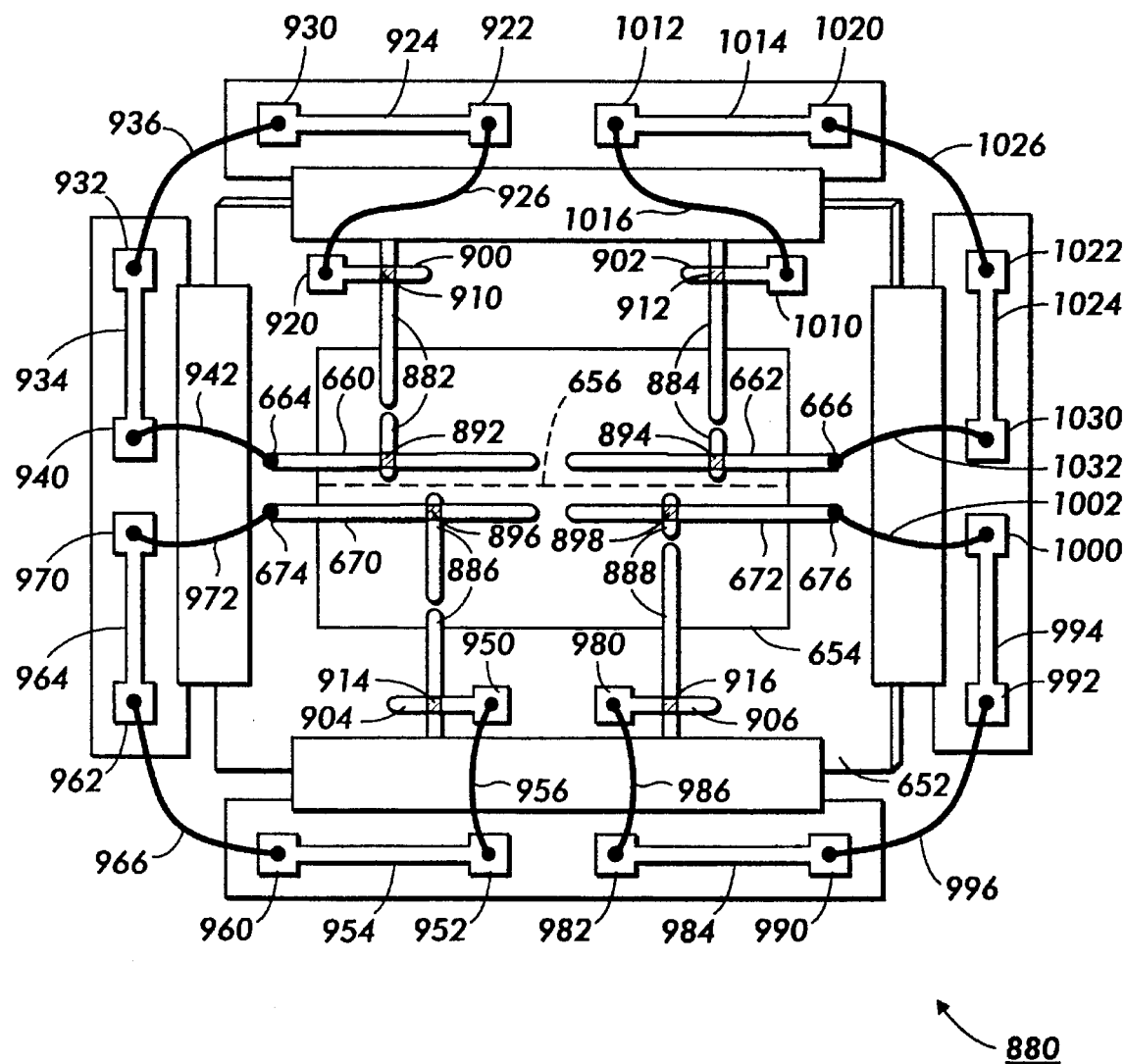
FIG. 19 is a schematic diagram showing a repaired array produced by the technique of FIG. 18.

FIGS. 18 and 19 show features of repair techniques. FIG. 18 shows acts in testing and repairing a split array with repair lines as described above. FIG. 19 shows a repaired array.

The act in box 850 in FIG. 18 begins by producing a split array that includes repair lines that are parallel to scan lines and that cross data lines. The act in box 850 can be implemented as described above in relation to FIGS. 13–17.

The act in box 852 then tests the split array for data line defects. Since each data line has only one accessible lead, this cannot be done with conventional continuity testing. Instead, test equipment such as the In-Process Tester (IPT) from Photon Dynamics, Inc., Milpitas, Calif. can be used to find defects in the array. As explained by Bond, J., and Levenson, M. D., "The US gears up to challenge Japan in flat panel displays," *Solid State Technology*, December 1993, pp. 37, 38, and 40–43, the IPT can use a noncontact method of performing voltage imaging on AMLCDs before cell assembly. The IPT can scan the substrate with light to collect data on the location and type of line defects, testing all the data lines.

The act in box 854 repairs data line shorts by laser cutting to eliminate each short. This act may include cutting a data line to create an open on each side of a short to a scan line, for example. This act can be performed with the Photon Dynamics LCD Panel Repair System using the integrated laser trim (ILT) capability described in the Sheng et al. article cited above.

The act in box 860 repairs data line opens, including any created in box 854, by laser welding each open data line to a repair line that it crosses and to a peripheral line that it crosses, as shown in FIG. 8. This act can also be performed with the Photon Dynamics LCD Panel Repair System, but using the integrated laser weld (ILW) capability described in the Sheng et al. article cited above to produce conductive paths between lines that cross.

The act in box 862 then assembles an LCD in the manner described in the Dense Array and Crossing Lines Applications, but with TABs as described above connecting leads on the split array to drive circuitry on PCBs around the edge of the split array. Because each data line in each part of the split array must be driven, data drivers cannot be interdigitated with alternate data lines driven from opposite ends. Instead, each data line must be driven, both from the top and from the bottom of the split array. Therefore, data drivers must be on 90 μm pitch, which may be achieved with overlapping TAB drivers or fine pitch TABs. Data drive circuitry may also be connected using techniques like those described in copending coassigned U.S. patent application No. 08/458,539, entitled "Display With Array and Multiplexer on Substrate and With Attached Digital-to-Analog Converter Integrated Circuit Having Many Outputs," incorporated herein by reference.

The act in box 864 completes repair of data line opens by soldering wires for each open data line so that one or more highly conductive lines on the PCBs are electrically connected between the connecting lead of the data line's repair line and the lead of the data line's peripheral line.

FIG. 19 shows features of a repaired array produced by the technique of FIG. 18 using array 650 in FIG. 13, with array region 654 on a surface of substrate 652, and with repair lines 660, 662, 670, and 672 having connecting leads 664, 666, 674, and 676, respectively. PCBs are connected around the edge of substrate 652 by TABs as in FIGS. 1 and 8.

Open lines 882, 884, 886, and 888 are electrically connected to repair lines 660, 662, 670, and 672 by laser welds 890, 892, 894, and 896, respectively. Open lines 882, 884, 886, and 888 are also electrically connected to peripheral lines 900, 902, 904, and 906 by laser welds 910, 912, 914, and 916, respectively.

Lead 920 on peripheral line 900 is electrically connected to lead 922 on conductive line 924 by wire 926. Lead 930 on conductive line 924 is in turn connected to lead 932 on conductive line 934 by wire 936. Lead 940 on conductive line 934 is in turn connected to connecting lead 664 by wire 942, completing the repair of open line 882.

Lead 950 on peripheral line 904 is electrically connected to lead 952 on conductive line 954 by wire 956. Lead 960 on conductive line 954 is in turn connected to lead 962 on conductive line 964 by wire 966. Lead 970 on conductive line 964 is in turn connected to connecting lead 674 by wire 972, completing the repair of open line 886.

Lead 980 on peripheral line 906 is electrically connected to lead 982 on conductive line 984 by wire 986. Lead 990 on conductive line 984 is in turn connected to lead 992 on conductive line 994 by wire 996. Lead 1000 on conductive line 994 is in turn connected to connecting lead 676 by wire 1002, completing the repair of open line 888.

Lead 1010 on peripheral line 902 is electrically connected to lead 1012 on conductive line 1014 by wire 1016. Lead 1020 on conductive line 1014 is in turn connected to lead 1022 on conductive line 1024 by wire 1026. Lead 1030 on conductive line 1024 is in turn connected to connecting lead 666 by wire 1032, completing the repair of open line 884.

D.4. Variations

The implementation described above could be changed in many ways within the scope of the invention.

The above implementation provides an array appropriate for an AMLCD, but the invention could be implemented in another type of display array, in another type of light valve array, in a sensor array, or in an emissive display such as a field emission display or a thin film electroluminescent display.

The above implementation provides an array of cells with particular dimensions and densities. The invention could be implemented with a wide variety of array sizes and shapes, cell sizes and shapes, and cell densities.

The above implementation adjusts sizes of cells so that artifacts resulting from paired lines are eliminated, but the invention could be implemented with different measures to eliminate artifacts or, in appropriate situations, without attempting to eliminate artifacts. Techniques for eliminating artifacts by adjusting sizes of light active units are described in greater detail in copending, coassigned U.S. patent application No. 08/579,048, entitled "Array With Light Active Units Sized to Eliminate Artifact From Size Difference," incorporated herein by reference. Alternatively, software correction techniques could be used to compensate signal levels for narrower rows of light active units, which could compensate for differences in size except when rows of different sizes all have the highest signal level, such as the brightest white in a display. Software correction techniques may be especially appropriate for sensor arrays.

The above implementation has repair lines that are parallel to and alongside scan lines, but repair lines could instead be centered between scan lines, with or without other measures to eliminate an artifact. Further, the above implementation has repair lines formed in the same layer as scan lines, but repair lines could be formed in other layers. The above implementation has repair lines formed in a lower layer than data lines, so that repair lines cross under data lines. Repair lines could instead cross over data lines.

The above implementation provides a split array in which four repairs of open data lines can be made using two repair structures each with two repair lines. The invention could be implemented with an array that is not split, in which case fewer repairs may be possible, or with an array with more or less repair structures or only one repair line per repair structure, allowing more or less repairs to be made. The invention could also be implemented to allow repair of lines other than data lines, such as scan lines. If not used in a split array, the invention could be implemented with interdigitated data drivers rather than with each data line driven from both ends.

The above implementation provides an active matrix array, but the invention could also be implemented in a passive matrix array.

The above implementation uses particular materials in a thin-film structure, but other materials could be used in other types of structures to implement the invention. Some examples are discussed in the Dense Array Application. For example, an array could be implemented with polysilicon TFTs rather than amorphous silicon TFTs, and some of the drive circuitry could be integrated on the same substrate as the array. Rather than metal lines, the data lines and scan lines could include other conductive materials such as doped semiconductive material. Rather than silicon nitride, the insulating layers could include other insulating materials.

The above implementation uses conductive lines on PCBs around the edge of a substrate with an array, but the invention could be implemented with conductive lines on the same substrate as the array, around the periphery of the array. Further, rather than using a particular TAB connection to PCBs, other TAB connections or other types of connection to drive circuitry, such as chip on glass techniques, could be used.

The above implementations use particular processes to produce a thin-film structure, but other processes could be used.

The above implementation uses a specific layout for each cell in an array, but other layouts could be used, including a layout in which a repair line is along the opposite side of the cell, as mentioned above in relation to FIG. 15.

The implementation described above includes layers in a specific sequence, but the sequence of layers could be modified, such as by producing a top gate TFT structure.

E. Application

The invention could be applied in many ways, including repair of data lines or scan lines in display arrays, light valve arrays, sensor arrays, and emissive displays such as field emission displays and thin film electroluminescent displays.

F. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. An article of manufacture comprising:

a first substrate with a surface at which circuitry can be formed;

first array circuitry formed at the surface of the first substrate, the first array circuitry comprising:

a first set of lines extending across the surface of the first substrate;

a second set of lines extending across the surface of the first substrate so that each of the first set of lines and each of the second set of lines cross in a crossing region within which the crossing lines are insulated from each other; all of the crossing regions being within a first array region of the surface of the first substrate;

for each of the lines in the first and second sets, a signal lead for electrically connecting the line to signal circuitry for the line; each of the lines in the first and second sets being electrically connected to its signal lead; and a first repair structure; the first repair structure comprising:

a first repair line that is approximately parallel to at least one of the lines in the first set within the first array region and that crosses a subset of the lines in the second set within the first array region; each of the lines in the subset crossing the first repair line in a repair crossing region; the first repair line and each line in its crossing subset being separated in their repair crossing region by an insulating layer in such a way that an electrical connection can be formed between the first repair line and the line in its crossing subset by operating on their repair crossing region; and a connecting lead for the first repair line; the connecting lead being outside the first array region and electrically connected to the first repair line so that the first repair line can be electrically connected through the connecting lead to the signal circuitry for a line in the first repair line's crossing subset.

2. The article of claim 1 in which the first repair line is parallel to and alongside one of the lines in the first set.

3. The article of claim 1 in which the first array region has a first side and a second side opposite the first side; the signal leads of the lines in the second set being in a peripheral region along the first side of the first array region; the first repair line being along the second side of the first array region so that the first repair structure can be used to repair an open that occurs in one of the lines in the first repair line's crossing subset at any position between the first and second sides of the array region.

4. The article of claim 1 in which the first array circuitry further comprises:

a second repair structure; the second repair structure comprising:

a second repair line that is approximately parallel to at least one of the lines in the first set within the first array region and that crosses a subset of the lines in the second set within the first array region; each of the lines in the subset crossing the second repair line in a repair crossing region; the second repair line and each line in its crossing subset being separated in their repair crossing region by an insulating layer in such a way that an electrical connection can be formed between the second repair line and the line in its crossing subset by operating on their repair crossing region; and a connecting lead for the second repair line; the connecting lead being outside the first array region and electrically connected to the second repair line so that the second repair line can be electrically connected through the connecting lead to the signal circuitry for a line in the second repair line's crossing subset.

5. The article of claim 1 in which the first repair line's crossing subset includes all the lines in the second set.

6. The article of claim 1 in which the first repair structure further comprises:

a second repair line that is collinear with the first repair line within the first array region and that crosses a subset of the lines in the second set within the first array region; each of the lines in the subset crossing the second repair line in a repair crossing region; the second repair line and each line in its crossing subset being separated in their repair crossing region by an insulating layer in such a way that the second repair line and the line in its crossing subset can be electrically connected by operating on their repair crossing region; the second repair line's crossing subset being mutually exclusive with the first repair line's crossing subset; and a connecting lead for the second repair line; the connecting lead being outside the first array region and electrically connected to the second repair line so that the second repair line can be electrically connected through the connecting lead to the signal circuitry for a line in the second repair line's crossing subset.

7. The article of claim 6 in which the crossing subsets of the first and second repair lines together include all the lines in the second set.

8. The article of claim 1 in which the array circuitry further comprises:

a first patterned metal layer; the first patterned metal layer including the first set of lines and the first repair line; and a second patterned metal layer; the second patterned metal layer including the second set of lines;

the insulating layer being between the first and second patterned metal layers in each repair crossing region.

9. The article of claim 8 in which the insulating layer in each of the repair crossing regions is meltable such that, when sufficient energy is applied to the repair crossing region, the insulating layer melts and metal from the first patterned metal layer mixes with metal from the second patterned metal layer to form an electrical connection between the first repair line and the line it crosses in the repair crossing region.

10. The article of claim 9 in which the first and second patterned metal layers each comprise aluminum; the insulating layer being a layer of silicon nitride.

11. The article of claim 8 in which the insulating layer has a structure in each of the repair crossing regions such that an opening can be formed in the insulating layer within the repair crossing region and metal from the first patterned metal layer and metal from the second patterned metal layer can contact each other in the opening to form an electrical connection between the first repair line and the line it crosses in the repair crossing region.

12. The article of claim 1 in which the insulating layer has a composition in each of the repair crossing regions such that a part of the insulating layer between the first repair line and the line it crosses in the repair crossing region can be made conductive to form an electrical connection between the first repair line and the line it crosses in the repair crossing region.

13. The article of claim 1 in which the array circuitry further comprises, for each of the repair crossing regions, a switchable element electrically connected between the first repair line and the line it crosses in the repair crossing region; the switchable element being an element that can be switched to a conductive state by electrical signals to form an electrical connection between the first repair line and the line it crosses in the repair crossing region.

14. The article of claim 1 in which the first set of lines extend in a first direction and the second set of lines extend in a second direction different than the first direction; the first array region having a first side and a second side opposite the first side; the signal leads of the lines in the second set being in a peripheral region along the first side of the first array region; the array circuitry further comprising:

a third set of lines extending in the first direction across the surface of the first substrate;

a fourth set of lines extending in the second direction across the surface of the first substrate so that each of the third set of lines and each of the fourth set of lines cross in a crossing region within which the crossing lines are insulated from each other; all of the crossing regions being within a second array region of the surface of the first substrate; the second array region having a first side and a second side opposite the first side;

for each of the lines in the third and fourth sets, a signal lead for electrically connecting the line to signal circuitry for the line; each of the lines in the third and fourth sets being electrically connected to its signal lead; the signal leads of the lines in the fourth set being in a peripheral region along the first side of the second array region; the second sides of the first and second array regions being adjacent so that the first and second array regions together form a split array; and a second repair structure; the second repair structure comprising:

a second repair line that is approximately parallel to at least one of the lines in the third set within the second array region and that crosses a subset of the lines in the fourth set within the second array region; each of the lines in the subset crossing the second repair line in a repair crossing region; the second repair line and each line in its crossing subset being separated in their repair crossing region by an insulating layer in such a way that an electrical connection can be formed between the second repair line and the line in its crossing subset by operating on their repair crossing region; and a connecting lead for the second repair line; the connecting lead being outside the second array region and electrically connected to the second repair line so that the second repair line can be electrically connected through the connecting lead to the signal circuitry for a line in the second repair line's crossing subset.

15. The article of claim 14 in which the first repair line is along the second side of the first array region and the second repair line is along the second side of the second array region.

16. The article of claim 1 in which the first set of lines extend in a first direction and the second set of lines extend in a second direction different than the first direction; the first array region having a first side and a second side opposite the first side; the signal leads of the lines in the second set being in a peripheral region along the first side of the first array region; the first substrate having an edge along the second side of the first array region; the first set of lines extending in a first direction generally parallel to the edge of the first substrate and the second set of lines extending in a second direction different than the first direction; the article further comprising:

a second substrate with a surface at which circuitry can be formed; the second substrate having an edge abutting the edge of the first substrate;

second array circuitry formed at the surface of the second substrate, the second array circuitry comprising:

a third set of lines extending in the first direction across the surface of the second substrate;

a fourth set of lines extending in the second direction across the surface of the second substrate so that each of the third set of lines and each of the fourth set of lines cross in a crossing region within which the crossing lines are insulated from each other; all of the crossing regions being within a second array region of the surface of the second substrate; the second array region having a first side and a second side opposite the first side; the second side being along the edge of the second substrate;

for each of the lines in the third and fourth sets, a signal lead for electrically connecting the line to signal circuitry for the line; each of the lines in the third and fourth sets being electrically connected to its signal lead; the signal leads of the lines in the fourth set being in a peripheral region of the surface of the second substrate along the first side of the second array region; the first and second array regions together forming a split array; and a second repair structure; the second repair structure comprising:

a second repair line that is approximately parallel to at least one of the lines in the third set within the second array region and that crosses a subset of the lines in the fourth set within the second array region; each of the lines in the subset crossing the second repair line in a repair crossing region; the second repair line and each line in its crossing subset being separated in their repair crossing region by an insulating layer in such a way that the second repair line and the line in its crossing subset can be electrically connected by operating on their repair crossing region; and a connecting lead for the second repair line; the connecting lead being outside the second array region and electrically connected to the second repair line so that the second repair line can be electrically connected through the connecting lead to the signal circuitry for a line in the second repair line's crossing subset.

17. The article of claim 16 in which the first repair line is along the second side of the first array region and the second repair line is along the second side of the second array region.

18. The article of claim 1 in which the lines in the first set are scan lines and the lines in the second set are data lines.

19. The article of claim 1 in which all of the lines in the first set extend in a first direction and all of the lines in the second set extend in a second direction approximately perpendicular to the first direction.

20. An article of manufacture comprising:

a substrate with a surface at which circuitry can be formed;

array circuitry formed at the surface of the substrate, the array circuitry comprising:

a first set of lines extending across the surface of the substrate;

a second set of lines extending across the surface of the substrate so that each of the first set of lines and each of the second set of lines cross in a crossing region within which the crossing lines are insulated from each other; all of the crossing regions being within an array region of the surface of the substrate;

for each of the lines in the first and second sets, a signal lead for electrically connecting the line to signal circuitry for the line; each of the lines in the first and second sets being electrically connected to its signal lead; and a repair structure; the repair structure comprising:

a repair line that is approximately parallel to at least one of the lines in the first set within the array region and that crosses a subset of the lines in the second set within the array region; each of the lines in the subset crossing the repair line in a repair crossing region; the crossing subset including an open line having an open at a location between the open line's signal lead and the repair crossing region in which the repair line and the open line cross; the repair line and the open line being electrically connected in their repair crossing region; the repair line and each of the lines in the subset other than the open line being separated in their repair crossing region by an insulating layer;

a connecting lead for the repair line; the connecting lead being outside the array region and electrically connected to the repair line; and a conductive line electrically connected between the connecting lead for the repair line and the signal circuitry for the open line so that the open line can receive signals from or provide signals to the signal circuitry as though the open line were continuous.

21. The article of claim 20 in which the substrate has an external edge that extends around and bounds the substrate; the repair line's connecting lead being near the substrate's external edge; the article further comprising:

a set of at least one printed circuit board attached to the substrate and positioned at the substrate's external edge; and a highly conductive line on the printed circuit board set, the highly conductive line being electrically connected between the repair line's connecting lead and the open line's signal circuitry.

22. The article of claim 20 in which the array region has a boundary; the repair line's connecting lead being outside the boundary of the array region; the article further comprising:

a highly conductive line on the substrate outside the boundary of the array region, the highly conductive line being electrically connected between the repair line's connecting lead and the open line's signal circuitry.

23. The article of claim 20 in which the second set of lines includes a first repairable subset, each of the lines in the first repairable subset extending out of the array region to its signal lead; the first repairable subset including the open line; the article further comprising:

a peripheral line outside the array region; the peripheral line crossing the lines in the first repairable subset; each of the lines in the first repairable subset crossing the peripheral line in a peripheral crossing region; the peripheral line and the open line being electrically connected in their peripheral crossing region; the repair line and each of the lines in the first repairable subset other than the open line being separated in their peripheral crossing region by an insulating layer; and a peripheral lead electrically connected to the peripheral line; the peripheral lead being electrically connected to the repair line's connecting lead.

24. An improved method of producing an article that includes array circuitry formed at a surface of a substrate; the array circuitry including:

a first set of lines extending across the surface of the substrate;

a second set of lines extending across the surface of the substrate so that each of the first set of lines and each of the second set of lines cross in a crossing region within which the crossing lines are insulated from each other; all of the crossing regions being within an array region of the surface of the substrate; and for each of the lines in the first and second sets, a signal lead for electrically connecting the line to signal circuitry for the line; each of the lines in the first and second sets being electrically connected to its signal lead;

the improved method comprising:

producing the array circuitry with a repair structure; the repair structure including:

a repair line that is approximately parallel to at least one of the lines in the first set within the array region and that crosses a subset of the lines in the second set within the array region; each of the lines in the subset crossing the repair line in a repair crossing region; the repair line and each line in its crossing subset being separated in their repair crossing region by an insulating layer in such a way that an electrical connection can be formed between the repair line and the line in its crossing subset by operating on their repair crossing region; and a connecting lead for the repair line; the connecting lead being outside the array region and electrically connected to the repair line so that the repair line can be electrically connected through the connecting lead to the signal circuitry for a line in the repair line's crossing subset;

identifying one of the lines in the repair line's crossing subset as open;

operating on the repair crossing region of the repair line and the open line to form an electrical connection between the repair line and the open line; and electrically connecting the repair line's connecting lead to receive signals from or provide signals to the open line's signal circuitry.

25. An article of manufacture comprising:

a substrate with a surface at which circuitry can be formed;

array circuitry formed at the surface of the substrate, the array circuitry comprising:

scan lines extending across the surface of the substrate; the scan lines including an upper set and a lower set; the upper set including an upper boundary scan line; the lower set including a lower boundary scan line; the upper and lower boundary scan lines being next to each other;

split data lines extending across the surface of the substrate so that each of the scan lines and each of the split data lines cross in a crossing region within which the scan line and split data line are insulated from each other; all of the crossing regions being within an array region of the surface of the substrate; each of the split data lines having an open between the crossing regions in which it crosses the upper and lower boundary scan lines; each of the split data lines including an upper data line that crosses each scan line in the upper set and a lower data line that crosses each scan line in the lower set;

for each of the scan lines and for each of the upper and lower data lines, a signal lead for electrically connecting the line to signal circuitry for the line; each of the scan lines and each of the upper and lower data lines being electrically connected to its signal lead; and first and second repair structures; the first repair structure comprising:

a first repair line that is approximately parallel to the upper boundary scan line within the array region and that crosses a subset of the upper data lines within the array region; each of the lines in the subset crossing the first repair line in a repair crossing region; the crossing subset including a first open line having an open at a location between the first open line's signal lead and the repair crossing region in which the first repair line and the first open line cross; the first repair line and the first open line being electrically connected in their repair crossing region; the first repair line and each of the lines in the crossing subset other than the first open line being separated in their repair crossing region by an insulating layer;

a connecting lead for the first repair line; the connecting lead being outside the array region and electrically connected to the first repair line; and a conductive line electrically connected between the connecting lead for the first repair line and the signal circuitry for the first open line so that the first open line can receive signals from or provide signals to the signal circuitry as though the first open line were continuous;

the second repair structure comprising:

a second repair line that is approximately parallel to the lower boundary scan line within the array region and that crosses a subset of the lower data lines within the array region; each of the lines in the subset crossing the second repair line in a repair crossing region; the crossing subset including a second open line having an open at a location between the second open line's signal lead and the repair crossing region in which the second repair line and the second open line cross; the second repair line and the second open line being electrically connected in their repair crossing region; the second repair line and each of the lines in the crossing subset other than the second open line being separated in their repair crossing region by an insulating layer;

a connecting lead for the second repair line; the connecting lead being outside the array region and electrically connected to the second repair line; and a conductive line electrically connected between the connecting lead for the second repair line and the signal circuitry for the second open line so that the second open line can receive signals from or provide signals to the signal circuitry as though the second open line were continuous.

26. The article of claim 25 in which the array circuitry is an active matrix array.

27. The article of claim 26 in which the article is an active matrix liquid crystal display.

* * * * *